United States Patent
Lee et al.

(10) Patent No.: US 12,376,274 B2
(45) Date of Patent: Jul. 29, 2025

(54) DEVICE FOR MANUFACTURING SIDE LINE, METHOD OF MANUFACTURING SIDE LINE AND METHOD OF MANUFACTURING DISPLAY DEVICE

(71) Applicant: LG Display Co., Ltd., Seoul (KR)

(72) Inventors: Hyoseob Lee, Seoul (KR); YoonSung Tak, Goyang-si (KR); YoungHo Kim, Paju-si (KR); Sungeun Bae, Paju-si (KR); JeeHun Kim, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 699 days.

(21) Appl. No.: 17/502,985

(22) Filed: Oct. 15, 2021

(65) Prior Publication Data
US 2022/0167537 A1    May 26, 2022

(30) Foreign Application Priority Data
Nov. 20, 2020 (KR) .......... 10-2020-0156355

(51) Int. Cl.
| | |
|---|---|
| *H05K 13/00* | (2006.01) |
| *G09G 3/32* | (2016.01) |
| *H01L 21/68* | (2006.01) |
| *H01L 21/683* | (2006.01) |
| *H01L 21/768* | (2006.01) |
| *H05K 13/06* | (2006.01) |
| *H10D 30/67* | (2025.01) |
| *H10H 29/10* | (2025.01) |
| *H10H 29/14* | (2025.01) |
| *H01L 21/67* | (2006.01) |

(52) U.S. Cl.
CPC ............... *H05K 13/06* (2013.01); *G09G 3/32* (2013.01); *H01L 21/683* (2013.01); *H01L 21/768* (2013.01); *H05K 13/0069* (2013.01); *H10D 30/67* (2025.01); *H10H 29/10* (2025.01); *H10H 29/142* (2025.01); *H01L 21/67138* (2013.01); *H01L 21/76817* (2013.01)

(58) Field of Classification Search
CPC ...... H05K 13/06; H05K 13/0069; G09G 3/32; H01L 21/768; H01L 27/15; H01L 29/786; H01L 21/67138; H01L 21/76817; H01L 27/156; H01L 21/683
See application file for complete search history.

(56) References Cited

U.S. PATENT DOCUMENTS

| | | | | |
|---|---|---|---|---|
| 6,257,461 | B1 * | 7/2001 | Fuchs | B05B 1/3436 222/541.9 |
| 2006/0181772 | A1 * | 8/2006 | Byers | G02B 7/1815 359/601 |

(Continued)

FOREIGN PATENT DOCUMENTS

| | | | | |
|---|---|---|---|---|
| JP | 2002309187 A | * | 10/2002 | ............... C09J 7/00 |
| JP | 2007208034 A | * | 8/2007 | ............... H05K 3/00 |

(Continued)

*Primary Examiner* — Yaovi M Ameh
(74) *Attorney, Agent, or Firm* — Birch, Stewart, Kolasch & Birch, LLP

(57) ABSTRACT

According to an aspect of the present disclosure, a device for manufacturing a side line includes a stage on which a substrate is loaded, a side guide configured to be disposed adjacent to a side portion of the substrate loaded on the stage, and a printing unit configured to print a conductive paste on the substrate.

22 Claims, 14 Drawing Sheets

(56) References Cited

U.S. PATENT DOCUMENTS

2007/0058148 A1\* 3/2007 Nakano ................ G03B 27/42
                                                                            355/53
2017/0354041 A1\* 12/2017 Yamaguchi ............ H05K 1/147

FOREIGN PATENT DOCUMENTS

| JP | 2014-175391 A | 9/2014 | |
|---|---|---|---|
| KR | 100810076 B1 \* | 3/2008 | ............ H01L 21/68 |
| KR | 10-2018-0115839 A | 10/2018 | |
| KR | 10-2019-0044014 A | 4/2019 | |
| WO | WO2004/029722 A2 | 4/2004 | |
| WO | WO-2011043567 A2 \* | 4/2011 | ............ B24B 37/32 |

\* cited by examiner

DEVICE FOR MANUFACTURING SIDE LINE, METHOD OF MANUFACTURING SIDE LINE AND METHOD OF MANUFACTURING DISPLAY DEVICE

CROSS-REFERENCE TO RELATED APPLICATIONS

This application claims the priority of Korean Patent Application No. 10-2020-0156355 filed on Nov. 20, 2020, in the Korean Intellectual Property Office, the disclosure of which is incorporated herein by reference into the present application.

BACKGROUND

Field

The present disclosure relates to a device for manufacturing a side line, a method of manufacturing a side line, and a method of manufacturing a display device, and more particularly, to a device for manufacturing a side line for manufacturing a display device using a light emitting diode (LED), a method of manufacturing the side line, and a method for manufacturing the display device.

Description of the Related Art

A liquid crystal display device (LCD) and an organic light emitting display device (OLED), which have been currently widely used, are gradually expanding their application ranges.

Since the liquid crystal display device and the organic light emitting display device can provide a high-resolution screen and can be lightweight and thin, the liquid crystal display device and the organic light emitting display device are widely applied to screens of daily electronic devices such as mobile phones and notebook computers, and their application ranges are gradually expanding.

However, the liquid crystal display device and the organic light emitting display device can have a limitation in reducing a bezel area that a user visually recognizes as an area in which an image is not displayed on the display devices. For example, in the case of the liquid crystal display device, since a sealant needs to be used to seal a liquid crystal and bond an upper substrate and a lower substrate, there can be a limitation in reducing the size of the bezel area.

In addition, in the case of the organic light emitting display device, since an organic light emitting diode is made of an organic material and is vulnerable to moisture or oxygen, an encapsulation for protecting the organic light emitting diode needs to be disposed, and therefore, there can be a limitation in reducing the size of the bezel area. In particular, since it can be difficult or may be impossible to implement an extra-large screen with a single panel, when a plurality of liquid crystal display panels or a plurality of organic light emitting display panels is disposed in a tile form to implement the extra-large screen, there can be a problem in that a bezel area between adjacent panels may be visually recognized by a user.

As an alternative, a display device including a light emitting diode (LED) is provided. Since the LED is made of inorganic materials instead of organic materials, the LED has excellent reliability, and thus, can have a longer lifespan compared to the liquid crystal display device or the organic light emitting display device. In addition, the LED can have a fast-lighting speed, low power consumption, excellent stability due to strong impact resistance, and display a high-brightness image. Thus, the LED is a device suitable for application to an extra-large screen.

Accordingly, an LED element is generally used in a display device for providing an extra-large screen capable of minimizing a bezel area.

SUMMARY OF THE DISCLOSURE

The inventors of the present disclosure have recognized that since the LED has better luminous efficiency than the organic light emitting diode, a display device including the LEDs can be much smaller than a display device using the organic light emitting didoes in terms of a size of one pixel, for example, a size of a light emitting area needed to emit light of the same luminance.

Accordingly, the inventors of the present disclosure have recognized that when the display device is implemented using the LEDs, a distance between light emitting areas of adjacent pixels can be much greater than a distance between light emitting areas of adjacent pixels in the organic light emitting display device having the same resolution.

Further, the inventors of the present disclosure have recognized that when providing a tiling display implemented by disposing a plurality of display panels in a tile form, a distance between an LED disposed on an outermost side of a display panel and an LED disposed on an outermost side of another display panel adjacent thereto can be implemented to be the same as a distance between LEDs disposed in one display panel. As such, it can be possible to implement a zero bezel in which there is substantially no bezel area. However, as described above, in order to make the distance between the LED disposed on the outermost side of the display panel and the LED disposed on the outermost side of another display panel adjacent thereto equal to the distance between the LEDs disposed within one display panel, various drivers such as a gate driver and a data driver, which are positioned on a top surface of the display panel in the related art, need to be positioned on a bottom surface of the display panel, instead of the top surface of the display panel.

Accordingly, the inventors of the present disclosure have invented a display device having a new structure in which elements such as thin film transistors and LEDs are disposed on the top surface of the display panel, and drivers such as gate drivers and data drivers are disposed on the bottom surface of the display panel. In addition, the inventors of the present disclosure have invented a manufacturing technique of forming side lines on the side surface of the display panel to connect the elements disposed on the top surface of the display panel and the drivers disposed on the bottom surface of the display panel. Specifically, side lines are formed on the display panel using a printing pad. Thus, the side lines can be formed on a large-area display panel without limiting the size of the display panel by performing printing plural times using a small-sized printing pad. Accordingly, the printing pad does not need to be replaced according to the size of the display panel, and thus, the replacement cost of the printing pad may be reduced.

On the other hand, the inventors of the present disclosure have recognized a limitation in that in the manufacturing apparatus for forming the side line having the above-described structure, the printing accuracy of the side line can be low, which can increase a defect rate of the display device. For example, when the width of the display panel is different from an integer multiple of a width of the printing pad in a longitudinal direction, the printing accuracy of the side line may be reduced at the corner of the display panel. In the center of the display panel, the printing pad is disposed on a surface parallel to the top surface of the display panel. However, when the printing pad is positioned at a corner of the display panel to form the side line, one end portion of the printing pad is disposed at the corner of the display panel, but the other end portion may be disposed in an empty space where the display panel is not disposed. As a result, in the portion where the display panel is not disposed, the printing pad can be inclined downward. Accordingly, in the corner portion of the display panel, the side line may not be formed in a desired shape, for example, a shape perpendicular to the top surface of the display panel, but may be formed in a shape bent toward the center of the display panel. In this case, when the side lines are printed on the top surface of the display panel, the display panel is turned over, and then the side lines are printed on the bottom surface of the display panel, there may a limitation in that the side lines that need not be connected to each other may be shorted. In addition, there may be a limitation in that since the side lines to be connected to each other are not connected, no signal is applied, or even if the side lines are connected to each other, a contact area is reduced to increase the resistance of the side lines and generate heat.

In particular, as the integration of the display panel is needed, the straightness of the side line can become an issue. For example, as the number of side lines increases, the spacing between wiring lines disposed on the side surface of the display panel can decrease. Accordingly, a contact defect of a plurality of side lines may occur even with a minute error in the process of forming the side lines, or a defect may occur in the display panel since the undesired wiring lines are connected, which can lead to an issue in yield and productivity of the display device.

In view of the above issues, the inventors of the present disclosure have invented a further improved device for manufacturing a side line capable of forming a side line with improved straightness in a corner region of a display panel by disposing a side guide for suppressing the side line from being inclined at a corner portion of the display panel, an improved method of manufacturing the side line, and an improved method of manufacturing a display device using the device for manufacturing the side line.

Accordingly, an object of the present disclosure is to provide a device for manufacturing a side line capable of easily improving straightness of the side line by suppressing an inclination of the side line, a method of manufacturing the side line, and a method of manufacturing a display device using the device for manufacturing the side line.

In addition, another object of the present disclosure is to provide a device for manufacturing a side line capable of reducing printing errors and improving yield and productivity even when side line printing is performed plural times, a method of manufacturing the side line, and a method of manufacturing a display device using the device for manufacturing the side line.

In addition, still another object of the present disclosure is to provide a device for manufacturing a side line capable of minimizing or eliminating damage occurring between a plurality of display panels upon implementing a tiling display and improving straightness of a side line, a method of manufacturing the side line, and a method of manufacturing a display device using the device for manufacturing the side line.

Objects of the present disclosure are not limited to the above-mentioned objects, and other objects, which are not mentioned above, can be clearly understood by those skilled in the art from the following descriptions.

According to an aspect of the present disclosure, a device for manufacturing a side line includes a stage on which a substrate is loaded, a side guide configured to be disposed adjacent to a side portion of the substrate loaded on the stage, and a printing unit configured to print a conductive paste on the substrate.

According to another aspect of the present disclosure, a method of manufacturing a side line includes loading a substrate on a stage, disposing a side guide on a side portion of the substrate, and printing a plurality of first side lines on a second surface which is opposite to a first surface of the substrate contacting with the stage using a printing pad, and a side surface of the substrate.

According to still another aspect of the present disclosure, a method of manufacturing a display device includes forming a plurality of thin film transistors, a plurality of LEDs, a plurality of gate lines, and a plurality of data lines on a top surface of a first substrate; forming a plurality of gate link lines and a plurality of data link lines on a bottom surface of a second substrate; bonding the first substrate and the second substrate; and forming a plurality of side lines to connect the plurality of gate lines and the plurality of gate link lines, and to connect the plurality of data lines and the plurality of data link lines. The forming of the plurality of side lines includes loading the first substrate and the second substrate on a stage, disposing a side guide on side portions of the first substrate and the second substrate, printing a plurality of first side lines connected to a wiring line disposed on one of the first substrate and the second substrate, and printing a plurality of second side lines connected to a wiring line disposed on the other one of the first substrate and the second substrate and connected to the plurality of first side lines.

Other detailed matters of the exemplary embodiments are included in the detailed description and the drawings.

According to the present disclosure, by disposing a guide bar on a side surface of a display panel to form a side line, it is possible to increase straightness and uniformity of the side line and improve printing quality of the side line.

According to the present disclosure, by disposing the guide bar on the side surface of the display panel during the process of manufacturing the side line, it is possible to more accurately connect a wiring line formed on a top surface of a display panel and a wiring line formed on a bottom surface thereof even if the wiring lines are printed plural times.

According to the present disclosure, by disposing a guide bar on a side surface of a display panel to print a side line, it is possible to manufacture a fine line with a reduced defect rate.

According to the present disclosure, it is possible to minimize damage occurring between a plurality of display panels when implementing a tiling display.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
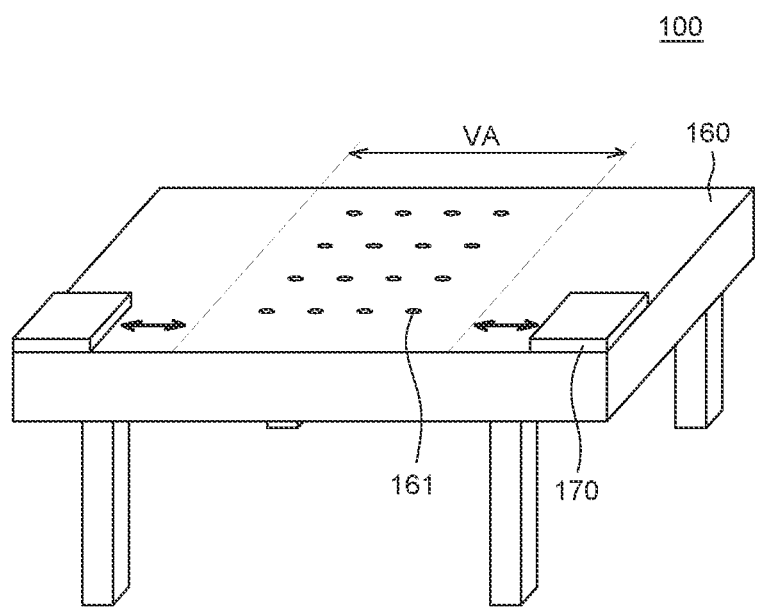
FIG. 1 is a schematic perspective view of a device for manufacturing a side line according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted or may be provided briefly to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a device and method for manufacturing a side line as well as a method for manufacturing a display device using the device for manufacturing the side line according to exemplary embodiments of the present disclosure will be described in detail with reference to accompanying drawings. All the components of each device for manufacturing a side line and each display device manufactured using the device for manufacturing the side line according to all embodiments of the present disclosure are operatively coupled and configured.

Figure 2:
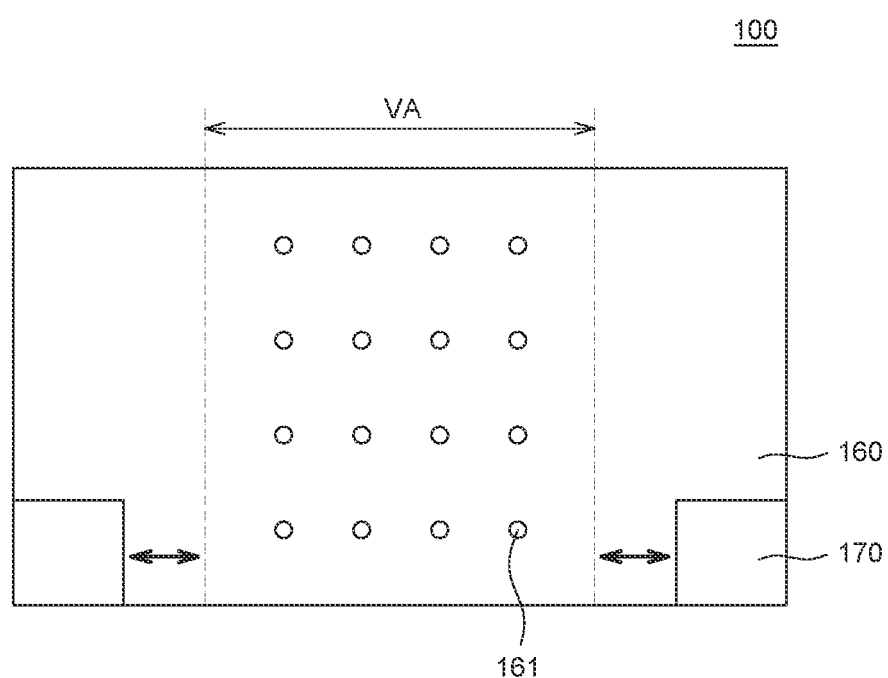
FIG. 2 is a schematic top surface view of the device for manufacturing a side line according to the embodiment of the present disclosure.

FIG. 1 is a schematic perspective view of a device for manufacturing a side line according to an embodiment of the present disclosure. FIG. 2 is a schematic top surface view of the device for manufacturing a side line according to the embodiment of the present disclosure.

Referring to FIGS. 1 and 2, a device 100 for manufacturing a side line includes a stage 160 and a plurality of side guides 170.

The stage 160 is a member supporting a substrate disposed on the device 100 for manufacturing a side line. Here, the substrate is an object on which a side line is printed, and in this specification, it is described as a substrate for convenience of description, but other objects such as a display panel can be used. The stage 160 can be made of a material having rigidity to support a substrate during a process of manufacturing a side line. In addition, the stage 160 can have a top surface having an area larger than that of the substrate to support the entire surface of the substrate.

The stage 160 includes a substrate fixing area VA. The substrate fixing area VA is an area in which the substrate disposed on the stage 160 is fixed, and a plurality of vacuum adsorption holes 161 is disposed in the substrate fixing area VA.

The plurality of vacuum adsorption holes 161 can form a vacuum pressure on the stage 160 to fix the substrate onto the stage 160. Accordingly, the plurality of vacuum adsorption holes 161 can adsorb the substrate in a vacuum method to fix the substrate on the stage 160, and after the manufacturing of the side line is completed, air is sprayed from the plurality of vacuum adsorption holes 161 to facilitate the desorption of the substrate. However, the present disclosure is not limited thereto, and other members capable of fixing or easily detaching the substrate to or from the stage 160 instead of the adsorption hole 161 are disposed in the substrate fixing area VA of the device 100 for manufacturing the side line.

A plurality of side guides 170 is disposed on the stage 160. The plurality of side guides 170 can be disposed in an area other than the substrate fixing area VA of the stage 160 in an initial state. The plurality of side guides 170 is disposed on the top surface of the stage 160, and the plurality of side guides 170 can have the same thickness as a substrate to be disposed on the stage 160. Also, the plurality of side guides 170 can have rounded corners. In addition, the plurality of side guides 170 can be made of a material having the same modulus as that of the substrate. Although it is illustrated that two side guides 170 are used in FIGS. 1 and 2, the number of side guides 170 is not limited thereto, and other numbers or variations are part of the present disclosure. A more detailed description of the thickness and physical properties of the plurality of side guides 170 will be described later.

FIGS. 1 and 2 illustrate that the plurality of side guides 170 as being disposed at both ends of the stage 160, respectively, in the initial state, but the present disclosure is not limited thereto. The plurality of side guides 170 can be received in the stage 160 in the initial state. In this case, the plurality of side guides 170 can be taken out from the inside of the stage 160 and disposed on the stage 160 when the side line is manufactured. However, the present disclosure is not limited thereto, and the plurality of side guides 170 can be disposed outside the stage 160 so as to be spaced apart from the stage 160 in the initial state, and can thereafter be disposed on the stage 160 when the side line is manufactured (e.g., when the side line manufacturing process begins or just prior to the start of the side line manufacturing process).

The device 100 for manufacturing a side line can further include a side guide driver capable of moving the plurality of side guides 170. For example, the side guide driver can transmit power to the side guide 170 so that the plurality of side guides 170 can move during the process of manufacturing the side line. Accordingly, the side guide 170 can move, for example, in an arrow direction as illustrated in FIGS. 1 and 2 to be disposed to be spaced apart from the substrate fixing area VA by the side guide driver and then adjacent to the substrate fixing area VA. The side guide driver can be configured separately from the stage 160 or can be configured integrally.

The device 100 for manufacturing a side line can further include an imaging unit. The imaging unit can be a device for confirming alignment of the substrate disposed on the stage 160. When manufacturing the side line, the substrate can be aligned on the stage 160 to form the side line in a designed area. For example, alignment marks are disposed on the substrate and the stage 160, and the imaging unit can photograph the substrate and the stage 160 together, thereby confirming whether the substrate on the stage 160 is accurately aligned.

Figure 3:
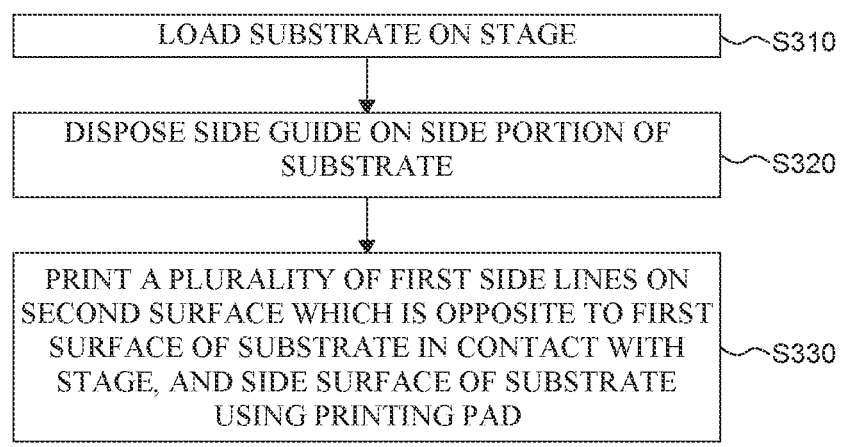
FIG. 3 is a flowchart illustrating a method of manufacturing a side line according to an embodiment of the present disclosure.

FIG. 3 is a flowchart illustrating a method of manufacturing a side line according to an embodiment of the present disclosure. FIGS. 4A to 4I are diagrams for describing a method of manufacturing a side line and a method of manufacturing a display device according to an embodiment of the present disclosure.

Figure 4A:
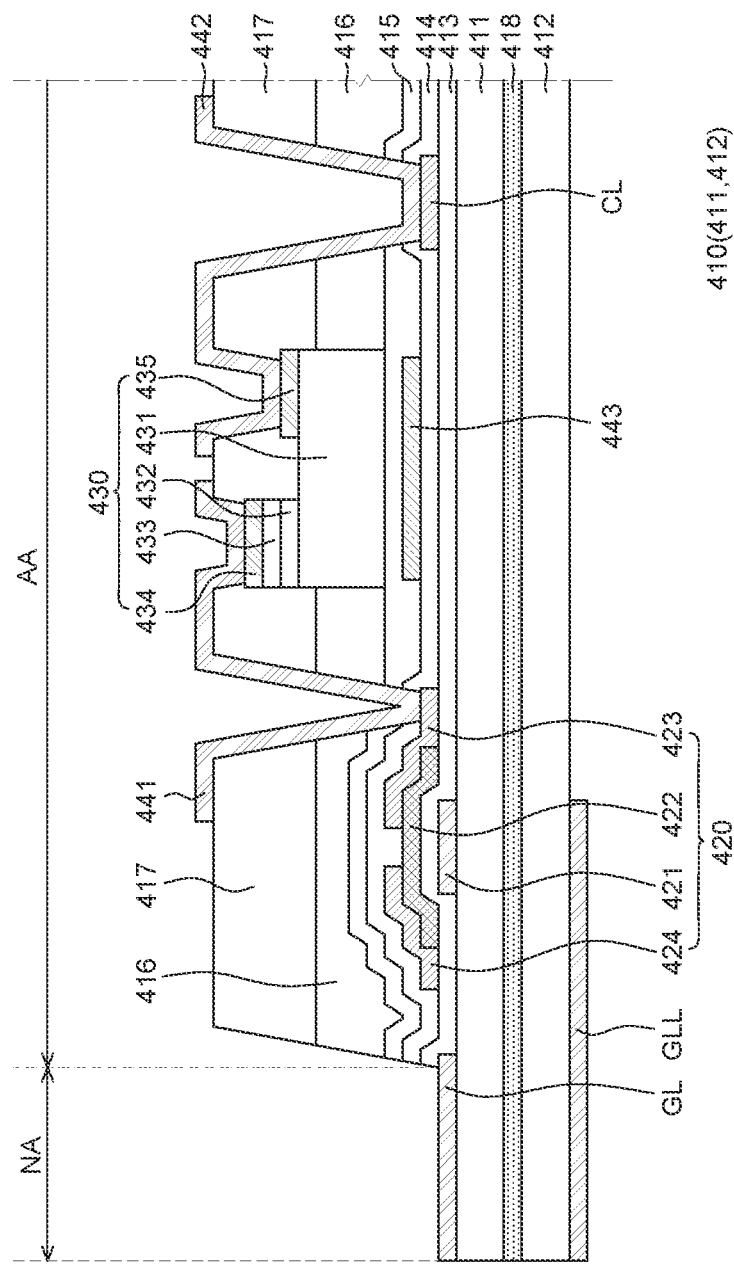
FIGS. 4A to 4I are diagrams for describing a method of manufacturing a side line and a method of manufacturing a display device according to an embodiment of the present disclosure.
Figure 4B:
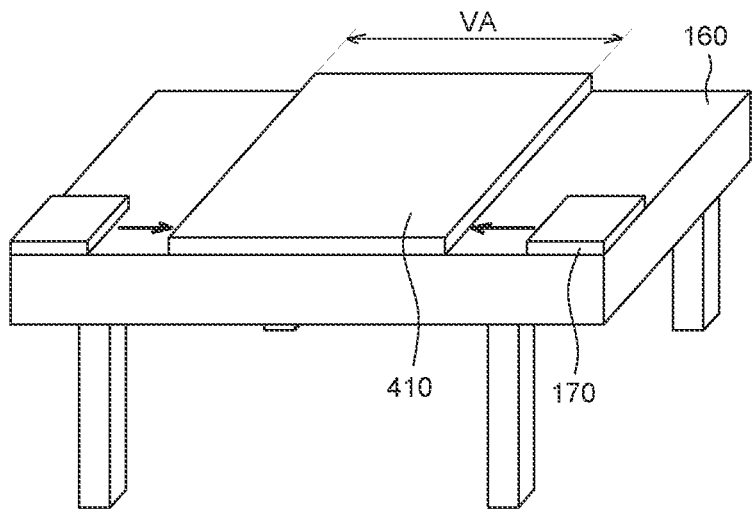
Figure 4C:
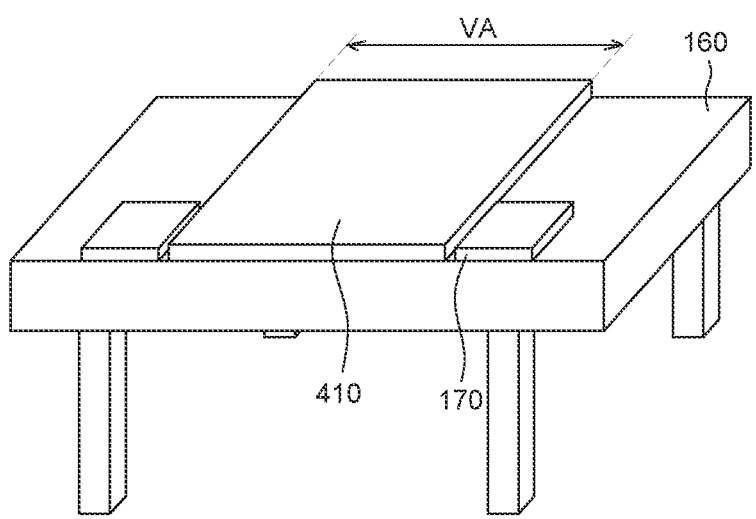
Figure 4D:
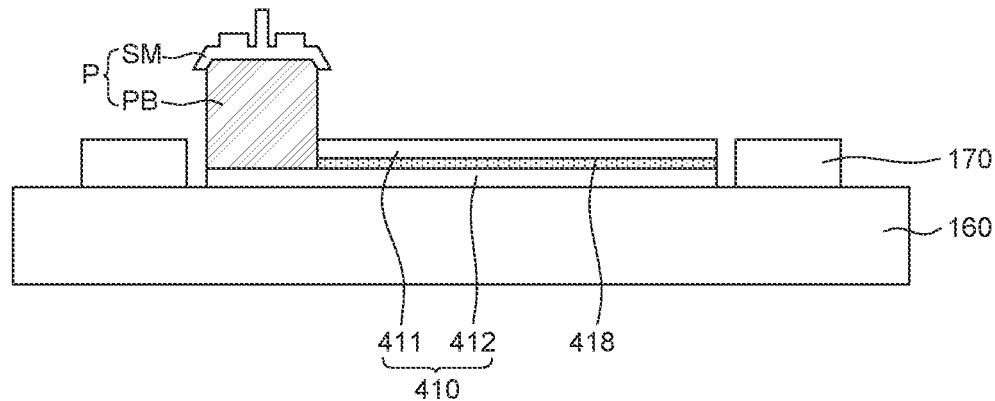
Figure 4E:
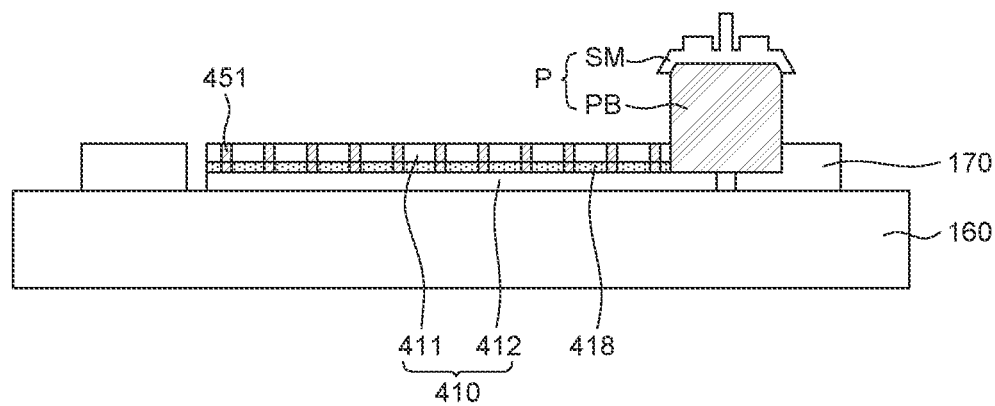
Figure 4F:
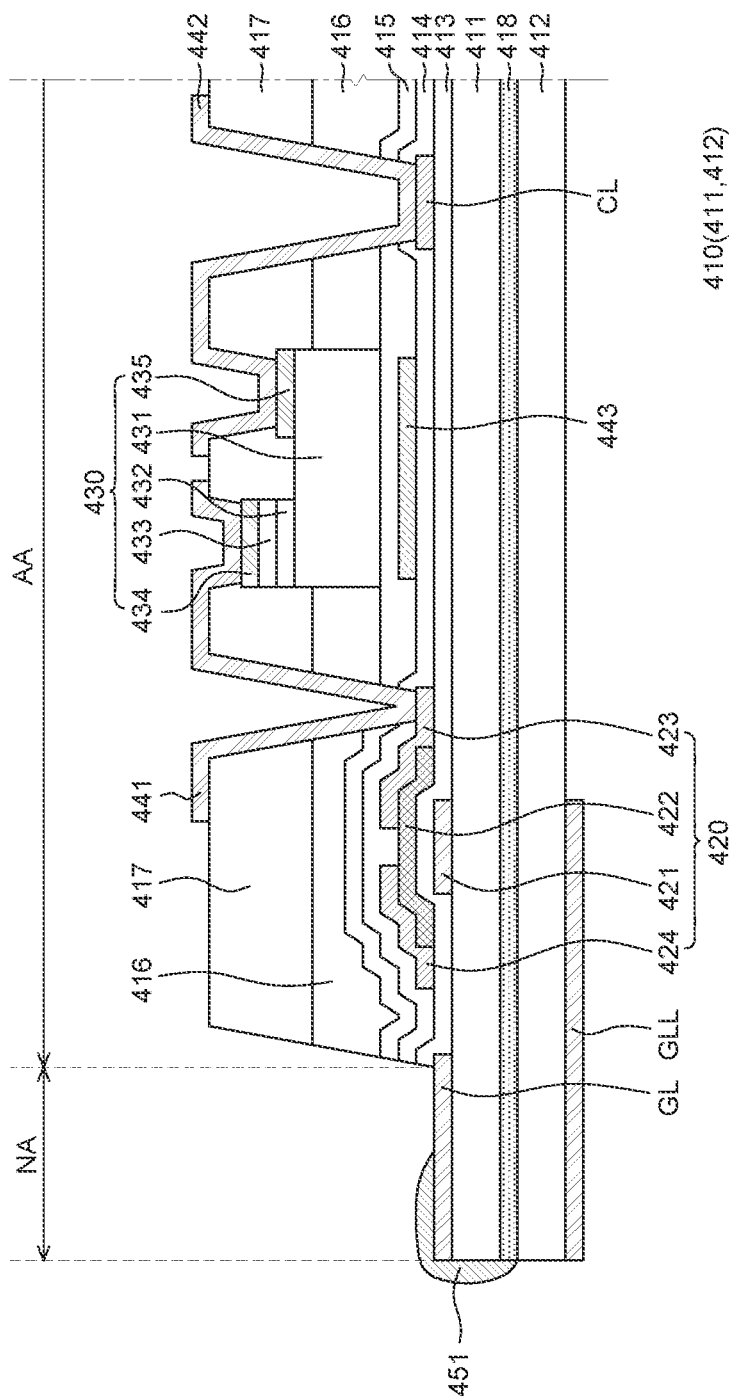
Figure 4G:
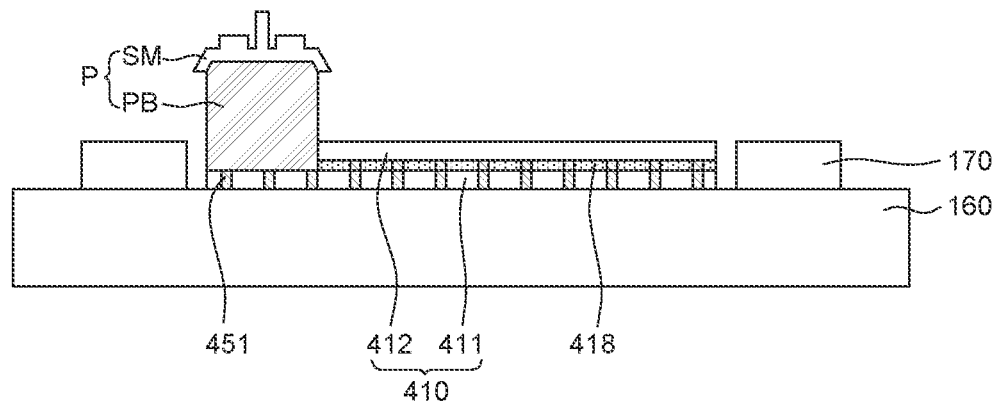
Figure 4H:
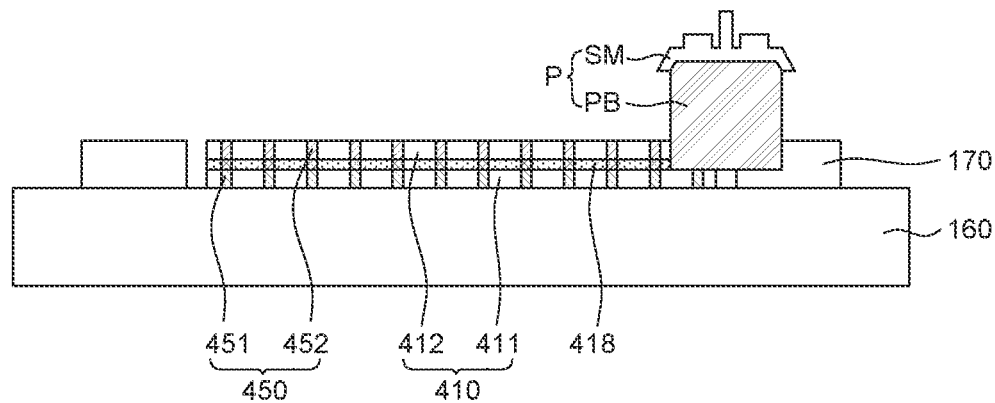
Figure 4I:
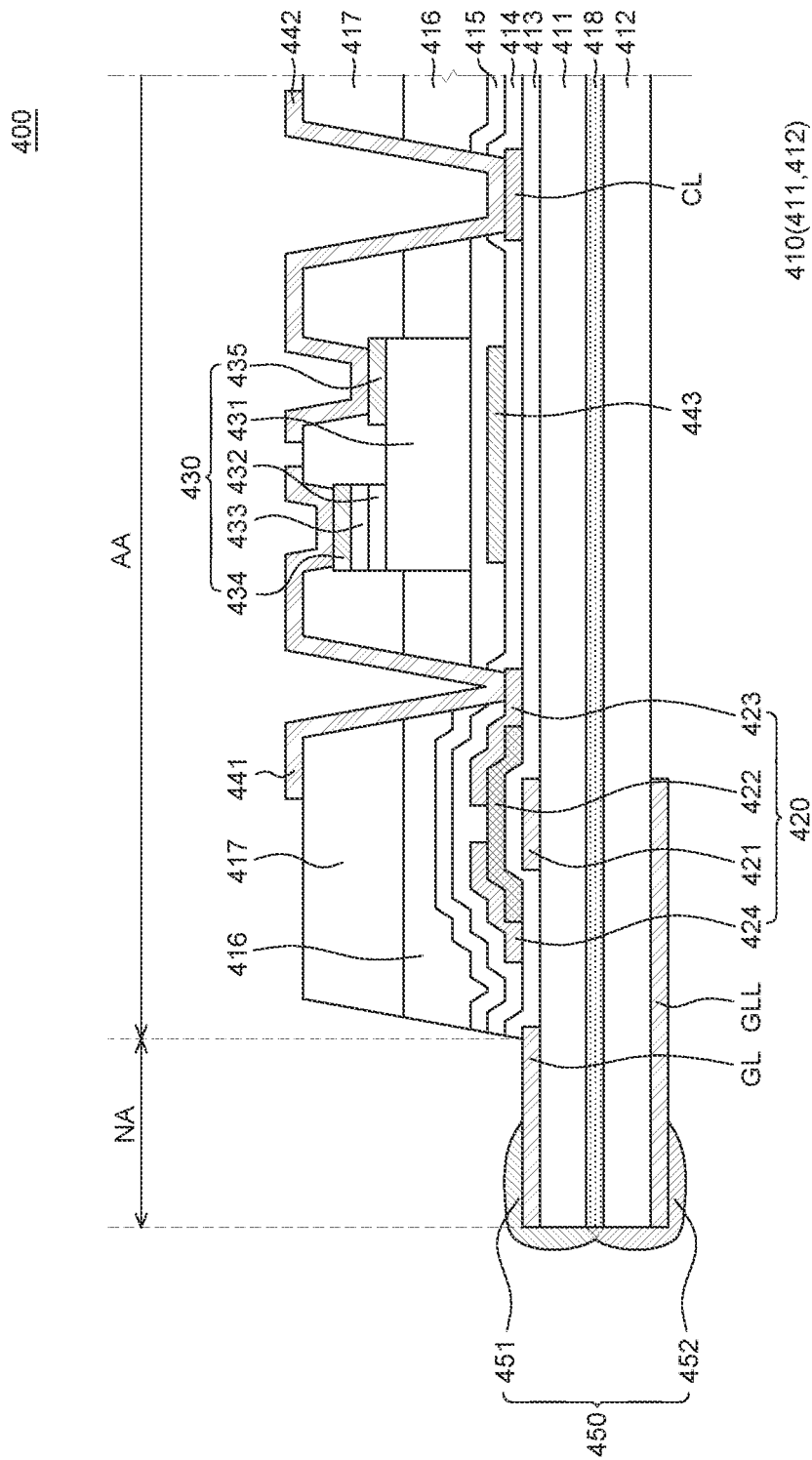

Particularly, FIG. 4A is a schematic cross-sectional view of the substrate. FIG. 4B is a schematic perspective view of a device for manufacturing a side line on which the substrate is loaded. FIG. 4C is a schematic perspective view of a device for manufacturing a side line in a state in which a side guide is disposed on a side portion of the substrate. FIGS. 4D and 4E are schematic side surface views of the device for manufacturing a side line on which the substrate is loaded for describing a process of printing a first side line. FIG. 4F is a schematic cross-sectional view of the substrate on which the first side line is formed. FIGS. 4G and 4H are schematic side surface views of the device for manufacturing a side line on which the substrate is loaded for describing a process of printing a second side line. FIG. 4I is a schematic cross-sectional view of the substrate on which the second side line is formed.

In FIGS. 4A to 4I, it is assumed that a substrate 410 on which a side line is formed is a display panel on which an LED 430 is disposed, but the present disclosure is not limited thereto. Therefore, an object for connecting a conductive component disposed on the substrate on which the side line is formed, for example, a top surface thereof and a conductive component disposed on a bottom surface thereof can be variously changed. FIGS. 4D, 4E, 4G, and 4H illustrate only the substrate 410 and a bonding layer 418 for convenience of illustration.

Referring to FIG. 4A, the substrate 410 includes a first substrate 411 and a second substrate 412. The first substrate 411 is a substrate that supports components disposed on the display device 400, and can be an insulating substrate. For example, the first substrate 411 can be made of glass, resin, or the like. Further, the first substrate 411 can include a polymer or plastic. In some embodiments, the first substrate 411 can be made of a plastic material having flexibility.

The first substrate 411 includes an LED 430 and a thin film transistor 420. Hereinafter, the display device 400 will be described as a top emission type display device, but the present disclosure is not limited thereto.

The first substrate 411 includes a display area AA and a non-display area NA surrounding the display area AA. The display area AA is an area in which an image is actually displayed in the display device, and can be provided with an LED 430 and a thin film transistor 420 for driving the LED 430. The non-display area NA is an area in which an image is not displayed and can be defined as an area surrounding the display area AA. Various lines such as a gate line GL and a data line connected to the LED 430 and the thin film transistor 420 disposed in the display area AA can be disposed in the non-display area NA.

Referring to FIG. 4A, a thin film transistor 420 is disposed on a first substrate 411. As the thin film transistor 420, a thin film transistor having a bottom gate structure in which a gate electrode 421 is disposed at a lowermost portion, an active layer 422 is formed on the gate electrode 421, and a source electrode 423 and a drain electrode 424 are formed on the active layer 422 is illustrated, but the present disclosure is not limited thereto.

A passivation layer 414 for protecting the thin film transistor 420 is disposed on the source electrode 423 and the drain electrode 424. However, the passivation layer 414 may be omitted in some embodiments.

A gate line GL is formed on the same layer as the gate electrode 421. The gate line GL can be made of the same material as the gate electrode 421. The gate line GL is disposed in the display area AA and the non-display area NA. Although only the gate line GL is illustrated in FIG. 4A, a data line or other signal lines can be disposed on the first substrate 411.

A common line CL is disposed on a gate insulating layer 413. The common line CL is a wiring line for applying a common voltage to the LED 430, and can be disposed to be spaced apart from the gate line GL or the data line. Further, the common line CL can extend in the same direction as the gate line GL or the data line. The common line CL can be made of the same material as the source electrode 423 and the drain electrode 424 or the gate electrode 421, but the present disclosure is not limited thereto.

A reflective layer 443 is disposed on the passivation layer 414 in the display area AA. The reflective layer 443 is a layer for reflecting light emitted toward the first substrate 411 among light emitted from the LED 430 to an upper portion of the display device 400 to emit the light to the outside of the display device. The reflective layer 443 can be made of a metal material having high reflectivity.

An adhesive layer 415 is disposed on the reflective layer 413. The adhesive layer 415 is an adhesive layer 415 for bonding the LED 430 on the reflective layer 443, and can insulate the reflective layer 443 made of a metal material from the LED 430. The adhesive layer 415 can be made of a heat-curable material or a light-curable material, but the present disclosure is not limited thereto.

The LED 430 is disposed on the adhesive layer 415. The LED 430 includes an n-type layer 431, an active layer 432, a p-type layer 433, an n electrode 435, and a p electrode 434. In FIG. 4A, an LED having a lateral structure is illustrated as the LED 430, but the structure of the LED 430 is not limited thereto.

The n-type layer 431 is disposed under the LED 430. The n-type layer 431 is a layer for supplying electrons to the active layer 432, and can be formed by implanting n-type impurities into gallium nitride (GaN), but the present disclosure is not limited thereto.

The active layer 432 is disposed on the n-type layer 431. The active layer 432 is a light emitting layer that emits light by combining electrons and holes, and can be made of a nitride semiconductor, for example, indium gallium nitride (InGaN).

The p-type layer 433 is disposed on the active layer 432. The p-type layer 433 is a layer for implanting holes to the active layer 432, and can be formed by implanting p-type impurities into gallium nitride (GaN), but the present disclosure is not limited thereto.

The n electrode 435 is disposed on the n-type layer 431. The n electrode 435 can be made of indium tin oxide (ITO), indium zinc oxide (IZO), indium tin zinc oxide (ITZO), zinc oxide (ZnO), and a tin oxide (TO)-based transparent conductive oxide, but the present disclosure is not limited thereto.

The p electrode 434 is disposed on the p-type layer 433. The p electrode 434 can be made of indium tin oxide (ITO), indium zinc oxide (IZO), indium tin zinc oxide (ITZO), zinc oxide (ZnO), and a tin oxide (TO)-based transparent conductive oxide, but the present disclosure is not limited thereto. The p electrode 434 is made of the same material as the n electrode 435 and can be simultaneously formed through the same process, for example, a mask process, but the present disclosure is not limited thereto.

A first planarization layer 416 is disposed on the thin film transistor 420. A top surface of the first planarization layer 416 can have a surface parallel to the first substrate 411 in an area excluding the area in which the LED 430 is disposed and a contact hole. Accordingly, the first planarization layer 416 can planarize a step that can occur due to a component disposed thereunder.

A second planarization layer 417 is disposed on the first planarization layer 416. A top surface of the second planarization layer 417 can have a surface parallel to the first substrate 411 in an area excluding the contact hole. Accordingly, the first planarization layer 416 can planarize a step that can occur due to a component disposed thereunder. In this case, the second planarization layer 417 can be formed so that some areas of the p electrode 434 and the n electrode 435 of the LED 430 are opened. In FIG. 4A, the first planarization layer 416 and the second planarization layer 417 are illustrated as separate insulating layers, but the present disclosure is not limited thereto, and the first planarization layer 416 and the second planarization layer 417 can be integrally formed.

A first electrode 441 is disposed on the second planarization layer 417. The first electrode 441 can electrically connect the source electrode 423 of the thin film transistor 420 and the p electrode 434 of the LED 430 through the contact hole formed in the first planarization layer 416, the second planarization layer 417, the passivation layer 414, and the adhesive layer 415. However, the present disclosure is not limited thereto, and the first electrode 441 can be defined to be in contact with the drain electrode 424 of the thin film transistor 420 depending on the type of the thin film transistor 420.

A second electrode 442 is disposed on the second planarization layer 417. The second electrode 442 can electrically connect the common line CL and the n electrode 435 of the LED 430 through the contact hole formed in the first planarization layer 416, the second planarization layer 417, the passivation layer 414, and the adhesive layer 415. In FIG. 4A, it has been described that the thin film transistor 420 is electrically connected to the p electrode 434 and the common line CL is electrically connected to the n electrode 435, but the present disclosure is not limited thereto. Accordingly, the thin film transistor 420 can be electrically connected to the n electrode 435, and the common line CL can be electrically connected to the p electrode 434.

Although it has been described that the first substrate 411 includes the display area AA and the non-display area NA in FIG. 4A, the present disclosure is not limited thereto and the first substrate 411 may not include the non-display area NA. For example, when the tiling display is implemented using the display device 400 manufactured by the method of manufacturing a side line and the method of manufacturing a display device according to the embodiment of the present disclosure, since the distance between the outermost LED 430 of one display panel and the outermost LED 430 of the other display panel adjacent thereto can be implemented to be the same as the distance between the LEDs 430 in one display panel, it is possible to implement a zero bezel in which there is substantially no bezel area. Accordingly, it can be described that the first substrate 411 is defined as having only the display area AA and the non-display area NA may not be defined in the first substrate 411.

The second substrate 412 is a substrate that supports components disposed under the second substrate 412, and can be an insulating substrate. For example, the second substrate 412 can be made of glass, resin, or the like. Also, the second substrate 412 can include a polymer or plastic. The second substrate 412 can be made of the same material as the first substrate 411. In some embodiments, the second substrate 412 can be made of a plastic material having flexibility.

A plurality of gate link lines GLL and a plurality of data link lines are formed on the bottom surface of the second substrate 412. The plurality of gate link lines GLL can be wiring lines for connecting the plurality of gate lines GL formed on the top surface of the first substrate 411 and the gate driver. The plurality of data link lines can be wiring lines for connecting a plurality of data lines formed on the top surface of the first substrate 411 and the data driver. The plurality of gate link lines GLL and the plurality of data link lines can extend from an end of the second substrate 412 toward the center of the second substrate 412.

The gate driver can be disposed on the bottom surface of the second substrate 412 to be electrically connected to the plurality of gate link lines GLL, and the data driver can be disposed to be electrically connected to the plurality of data link lines. In this case, the gate driver and the data driver can be directly formed on the bottom surface of the second substrate 412, or can be disposed on the bottom surface of the second substrate 412 in a chip on film (COF) method, or can be disposed on the bottom surface of the second substrate 412 in such a manner as to be disposed on a printed circuit board (PCB), but the present disclosure is not limited thereto.

Referring to FIG. 4A, a bonding layer 418 is disposed between the first substrate 411 and the second substrate 412. The bonding layer 418 can bond the first substrate 411 and the second substrate 412. The bonding layer 418 can be made of a material that can be cured by various curing methods to bond the first substrate 411 and the second substrate 412 to each other. The bonding layer 418 can be disposed over the entire area between the first substrate 411 and the second substrate 412, or can be disposed only on a partial area. Meanwhile, although the structure in which the substrate 410 includes two substrates has been described in FIG. 4A, the present disclosure is not limited thereto, and the substrate 410 can be configured as a single substrate. For example, various components can be disposed on the top and bottom surfaces of one substrate 410.

Next, the substrate is loaded on the stage (S310).

Referring to FIG. 4B, one surface of the substrate 410 is disposed on the device 100 for manufacturing a side line so as to be in contact with the stage 160.

The substrate 410 is disposed in the substrate fixing area VA on the stage 160. The substrate 410 can be fixed on the stage 160 by the vacuum suction hole 161 formed in the fixing area VA.

The alignment of the substrate 410 disposed on the stage 160 can be confirmed through an imaging unit. For example, when alignment marks are disposed on the substrate 410 and the stage 160, it can be checked whether the substrate 410 on the stage 160 is accurately aligned through the imaging unit.

Next, the side guide is disposed on the side portion of the substrate (S320).

Referring to FIGS. 4B and 4C, the plurality of side guides 170 can be disposed adjacent to the side portion of the substrate 410. For example, the plurality of side guides 170 can be disposed to be spaced apart from the side surface of the substrate 410 to suppress damage that can occur on the side surface of the substrate 410. Specifically, a plurality of already formed side lines or other components can be disposed on the side surface of the substrate 410 on which the plurality of side guides 170 is disposed adjacent to each other. Accordingly, when the plurality of side guides 170 is disposed to be in contact with the substrate 410, the side lines or other components may be damaged. Therefore, by disposing the plurality of side guides 170 to be spaced apart from the side surface of the substrate 410, it is possible to suppress damage to the plurality of side lines or other components disposed on the side surface of the substrate 410 due to the contact with the plurality of side guides 170.

Next, a plurality of first side lines is printed on the second surface which is opposite to the first surface of the substrate contacting with the stage and the side surface of the substrate using the printing pad (S330).

A printing unit can be disposed on the top surface of the first substrate 411 that is the second surface of the substrate 410. The printing unit includes a printing pad P for printing the plurality of first side lines 451 on the substrate 410. The printing unit can include a printing pad driver configured to move the printing pad P.

The pad P can include a support member SM and a pad body PB fixed to the support member SM. The support member SM is a structure for fixing the pad body PB. The pad body PB is a member for printing a plurality of side lines 450 on the substrate 410. For example, the side line 450 can be formed by printing the pad body PB on the substrate 410 in a state in which the conductive paste is applied to the pad body PB. In this case, the conductive paste can be in a state in which a material having high electrical conductivity, such as silver (Ag) or copper (Cu), is prepared in the form of a paste.

The printing pad P can be in contact with the side surface of the substrate 410 and a portion of the top surface of the substrate 410, and the plurality of side lines 450 can be formed on the substrate 410 contacting with the printing pad P.

Referring to FIGS. 4D and 4E, the first surface of the substrate 410 contacting with the stage 160 is the bottom surface of the second substrate 412 in the substrate 410, and the second substrate 412 is disposed to be in contact with the stage 160. For example, the printing pad P can print a plurality of first side lines 451 on a top surface that is a second surface which is opposite to the first surface of the substrate 410 and a side surface of the substrate 410. The printing pad driver can lower the printing pad P while the substrate 410 is loaded on the stage 160 to print the plurality of first side lines 451 on the top and side surfaces of the substrate 410.

The plurality of first side lines 451 can be formed by printing the printing pad P on the substrate 410 plural times. For example, the plurality of first side lines 451 can be formed in such a manner that the printing pad P moves from one end to the other end of the substrate 410 and the conductive paste is printed plural times.

The plurality of first side lines 451 is disposed on the side surface of the substrate 410 in such a manner that the printing pad P prints the conductive paste. Each of the plurality of first side lines 451 disposed on the top surface of the substrate 410 and on the side surface of the substrate 410 can be disposed on the side surface of the substrate 410 to be shorter than a length of the side surface of the substrate 410.

Referring to FIG. 4E, a width of the substrate 410 disposed between the plurality of side guides 170 is different from an integer multiple of a width of the printing pad P in the longitudinal direction. Thus, when the printing of the plurality of first side lines 451 is started by disposing the printing pad P to be adjacent to one end of the substrate 410, the printing pad P can be disposed at a position where a portion of the printing pad P overlaps the substrate 410, and the other portion thereof overlaps the side guide 170 when the plurality of first side lines 451 is printed on the other end of the substrate 410. Accordingly, the printing pad P can print the plurality of first side lines 451 on both of one side of the substrate 410 and one side of the side guide 170 disposed adjacent to one side of the substrate 410. However, the present disclosure is not limited thereto, and since the printing can be performed at a position where the printing pad P does not overlap the substrate 410 due to a process error, etc., even if the width of the substrate 410 is equal to an integer multiple of the width of the printing pad P in the longitudinal direction, the plurality of side guides 170 can be used.

In this case, the plurality of side guides 170 can have the same thickness as the substrate 410 disposed on the stage 160. For example, when the plurality of first side lines 451 is printed using the printing pad P, a thickness of the side guide 170 can be the same as that of the plurality of substrates 410 so that the printing pad P is supported even on the outside of the substrate 410 at the same height as the substrate 410 by the side guide 170. However, when the thickness of the bonding layer 418 disposed between the first substrate 411 and the second substrate 412 is non-negligibly greater than the sum of the thicknesses of the first substrate 411 and the second substrate 412, the thickness of the side guide 170 can be equal to the sum of the thicknesses of the first substrate 411, the second substrate 412, and the bonding layer 418.

Further, the plurality of side guides 170 can be made of a material having the same modulus as that of the substrate. For example, when the plurality of first side lines 451 is printed using the printing pad P, the modulus of the side guide 170 can be the same as the modulus of the plurality of substrates 410, for example, the modulus of the first substrate 411 and the second substrate 412 so that the printing pad P is supported even on the outside of the substrate 410 at the same rigidity as the substrate 410 by the side guide 170. However, when the modulus of the bonding layer 418 disposed between the first substrate 411 and the second substrate 412 has a greater difference from the modulus of the first substrate 411 and the second substrate 412 than a predetermined value, the modulus of the side guide 170 can be equal to an average of the modulus of the first substrate 411, the second substrate 412, and the bonding layer 418.

Referring to FIG. 4F, the first side line 451 is disposed in the non-display area NA of the substrate 410. The first side line 451 is disposed on the gate line GL formed on the top surface of the first substrate 411 and extends to the side surface of the substrate 410. The first side line 451 can be shorter than a length of the side surface of the substrate 410 and may not be in contact with the gate link line GLL disposed on the bottom surface of the second substrate 412. In this case, the first side line 451 can be in contact only with the side surface of the first substrate 411, can be in contact only with the side surfaces of the first substrate 411 and the bonding layer 418, or can be in contact with the side surfaces of the first substrate 411, the bonding layer 418, and the second substrate 412.

Then, the plurality of second side lines connected to the plurality of first side lines is printed on the first surface of the substrate and the side surface of the substrate using the printing pad.

Referring to FIGS. 4G and 4H, the second surface of the substrate 410 contacting with the stage 160 is the top surface of the first substrate 411 in the substrate 410, and the first substrate 411 is disposed to be in contact with the stage 160. For example, the printing pad P can print a plurality of second side lines 452 on the bottom surface that is a first surface which is a surface opposite to the second surface of the substrate 410 and the side surface of the substrate 410. The printing pad driver can lower the printing pad P while the substrate 410 is loaded on the stage 160 to print the plurality of second side lines 452 on the bottom and side surfaces of the substrate 410.

In some embodiments, a drying process can be performed on the plurality of first side lines 451 before printing the plurality of second side lines 452. For example, after the plurality of first side lines 451 is printed by the printing pad P, the substrate 410 can move into, for example, a high temperature chamber to perform a high temperature drying process. After the drying process is performed, the top surface of the substrate 410 can be disposed to be in contact with the stage 160.

The plurality of second side lines 452 can be formed by printing the printing pad P on the substrate 410 plural times. In this case, the manufacturing process of printing the plurality of second side lines 452 on the bottom surface and side surfaces of the substrate 410 using the printing pad P can be substantially the same as the manufacturing process of printing the plurality of first side lines 451 described with reference to FIGS. 4D to 4E. For example, the plurality of second side lines 452 can be formed in such a manner that the printing pad P moves from one end to the other end of the substrate 410 and the conductive paste is printed plural times.

The plurality of second side lines 452 is disposed on the side surface of the second substrate 412 in such a manner that the printing pad P prints the conductive paste. Each of the plurality of second side lines 452 disposed on the bottom surface of the substrate 410 and on the side surface of the substrate 410 can be disposed on the side surface of the substrate 410 to be shorter than a length of the side surface of the substrate 410.

The plurality of second side lines 452 can be formed to have the same width as the plurality of first side lines 451 and can be disposed on the plurality of first side lines 451. For example, one end of the plurality of second side lines 452 can be disposed on the bottom surface of the second substrate 412, and the other end of the plurality of second side lines 452 can be disposed to overlap the plurality of first side lines 451. Accordingly, the plurality of second side lines 452 and the plurality of first side lines 451 can connect the top surface of the first substrate 411 and the bottom surface of the second substrate 412 in a vertical direction.

Referring to FIG. 4I, the second side line 452 is disposed in the non-display area NA of the substrate 410. The second side line 452 is disposed on the gate link line GLL formed on the bottom surface of the second substrate 412 and extends to the side surface of the substrate 410. The second side line 452 can be disposed to be shorter than the length of the side surface of the substrate 410 and may not be in contact with the gate line GL disposed on the top surface of the first substrate 411. In this case, the second side line 452 can be in contact only with the side surface of the second substrate 412, can be in contact only with the side surfaces of the second substrate 412 and the bonding layer 418, or can be in contact with the side surfaces of the second substrate 412, the bonding layer 418, and the first substrate 411.

Also, the second side line 452 can be in contact with the first side line 451 to form one side line 450. For example, the first side line 451 and the second side line 452 serve as one side line 450 that connects the gate line GL formed on the top surface of the first substrate 411 and the gate link line GLL formed on the bottom surface of the second substrate 412 to apply a gate signal from the gate driver to the thin film transistor 420 through the gate link line GLL and the gate line GL.

In some embodiments, a drying process can be performed on the plurality of second side lines 451 after printing the plurality of second side lines 452. For example, after the plurality of second side lines 452 is printed by the printing pad P, the substrate 410 can move into, for example, a high temperature chamber to perform a high temperature drying process. Through this drying process, an interface between the first side line 451 and the second side line 452 does not exist, so one side line 450 can be formed. However, the present disclosure is not limited thereto, and the side line 450 can be formed so that the interface exists between the first side line 451 and the second side line 452.

Although only the side line 450 for connecting the gate line GL and the gate link line GLL has been described in FIGS. 4A to 4I, the present disclosure is not limited thereto. Here, the device 100 for manufacturing a side line, the method of manufacturing a side line, and the method of manufacturing a display device according to the embodiment of the present disclosure can be used in various ways for the purpose of connecting a conductive component positioned on a top surface of an object such as the substrate 410 and a conductive element positioned on a bottom surface of the object. For example, the side line 450 can use to connect various link lines disposed on the bottom surface of the substrate 410 and various wiring lines such as a data line, a high potential power line, and a low potential power line disposed on the top surface of the substrate 410.

In the related art manufacturing device for forming a side line, the printing accuracy of the side line can be low, and therefore, the defect rate of the display device can be increased. For example, when the width of the display panel is different from an integer multiple of the width of the printing pad in the longitudinal direction or when the printing pad is positioned at the corner of the display panel to form the side line, one end of the printing pad is disposed at the corner of the display panel, but the other end can be disposed in an empty space where the display panel is not disposed. In this situation, the printing pad can be inclined downward in the portion where the display panel is not disposed, and the side line can be formed in a shape bent in a specific direction in the corner portion of the display panel. As a result, when the side line is printed on the top surface of the display panel, the display panel is turned over, and then the side lines are printed on the bottom surface of the display panel, there may a limitation in that the side lines that need not be connected to each other are shorted or the side lines that need to be connected to each other are not connected.

Accordingly, in the device 100 for manufacturing a side line, the method of manufacturing the side line, and the method of manufacturing a display device using the device 100 for manufacturing the side line according to the embodiment of the present disclosure, the plurality of side guides 170 for suppressing the printing pad P from being inclined can be disposed adjacent to the substrate 410 during the process of manufacturing the side line 450, thereby suppressing the printing pad P from being inclined during the process of printing the side line 450. Specifically, as the first side line 451 and the second side line 452 are printed using the printing pad P in the state in which the plurality of side guides 170 are disposed to be adjacent to the substrate 410 disposed on the stage 160, both the first side line 451 and the second side line 452 disposed at the corners of the substrate 410 can have a desired shape, for example, a shape extending in a direction perpendicular to the top and bottom surfaces of the substrate 410. As a result, the straightness and uniformity of the side line 450 can be improved.

Accordingly, in the device 100 for manufacturing a side line, the method of manufacturing a side line, and the method of manufacturing a display device according to the embodiment of the present disclosure, the first side line 451 and the second side line 452 can be accurately connected, and as a result, a signal to be transmitted through the side line 450 can be accurately transmitted and the occurrence of problems such as heat generation due to the increase in the resistance of the side line 450 can be minimized. As such, the yield and productivity of the display device 400 can also be improved by reducing the signal transmission defect due to the inaccurate formation of wiring lines.

Figure 5:
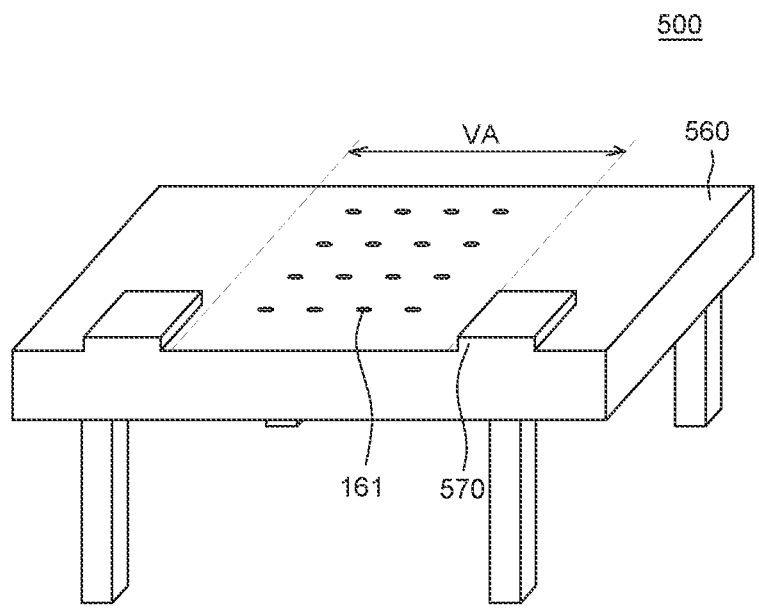
FIG. 5 is a schematic perspective view of a device for manufacturing a side line according to another embodiment of the present disclosure.

FIG. 5 is a schematic perspective view of a device for manufacturing a side line according to another embodiment of the present disclosure. A device 500 for manufacturing a side line illustrated in FIG. 5 is different from the device 100 for manufacturing a side line described with reference to FIGS. 1 to 4I in terms of only a stage 560 and a plurality of side guides 570, and other components are substantially the same, and therefore, redundant descriptions thereof will be omitted or may be provided briefly.

Referring to FIG. 5, the plurality of side guides 570 is disposed at both ends of the stage 560, and is formed integrally with the stage 560 to protrude from a top surface of the stage 560. The plurality of side guides 570 can be integrally formed with or into the stage 560 to correspond to a size of a substrate to be disposed on the stage 560. Accordingly, the plurality of side guides 570 can be disposed outside the substrate fixing area VA, and a distance between the plurality of side guides 570 can be greater than a width of the substrate fixing area VA. In addition, the distance between the plurality of side guides 570 can be designed in consideration of a process error that can occur when the substrate is loaded on the stage 560. As described above, as the plurality of side guides 570 are integrally formed with the stage 560, a side guide driver for driving the plurality of side guides 570 may not be included.

In the device 500 for manufacturing a side line according to another embodiment of the present disclosure, the plurality of side guides 570 can be disposed adjacent to the substrate during the process of manufacturing the side line, thereby suppressing the inclination of the printing pad during the process of printing the side line. In addition, in the device 500 for manufacturing a side line according to another embodiment of the present disclosure, since the side guide 570 is integrally formed with the stage 560 and fixed, after the substrate is loaded on the stage 560, the process of disposing the side guide 570 to be adjacent to the substrate by moving the side guide 570 may be omitted. Accordingly, in the device 500 for manufacturing a side line according to another embodiment of the present disclosure, the time and cost needed for manufacturing the side line can be reduced.

Figure 6:
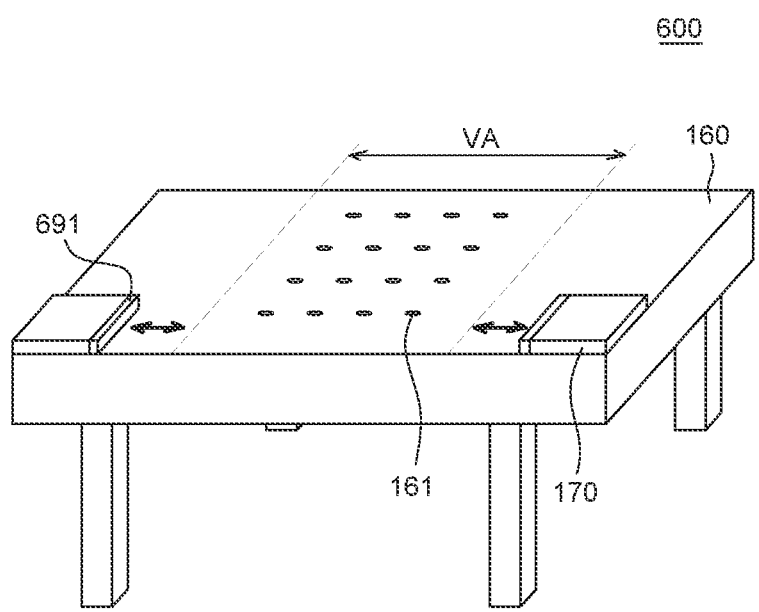
FIG. 6 is a schematic perspective view of a device for manufacturing a side line according to still another embodiment of the present disclosure.

FIG. 6 is a schematic perspective view of a device for manufacturing a side line according to still another embodiment of the present disclosure. A device 600 for manufacturing a side line illustrated in FIG. 6 is different from the device 100 for manufacturing a side line described with reference to FIGS. 1 to 4I in that only a buffer layer 691 is additionally disposed, and other components are substantially the same, and therefore, redundant descriptions thereof will be omitted or may be provided briefly.

Referring to FIG. 6, a plurality of buffer layers 691 can be disposed on one surface of the plurality of side guides 170. The plurality of buffer layers 691 are disposed on the stage 160 and disposed adjacent to a substrate to be disposed on the stage 160. The buffer layer 691 can be in contact with the side portion of the substrate disposed on the stage 160 during the printing of the plurality of side lines. For example, the plurality of buffer layers 691 can be disposed between the plurality of side guides 170 and the substrate to block direct contact between the plurality of side guides 170 and the substrate.

The plurality of buffer layers 691 can have the same thickness as the plurality of side guides 170. For example, the plurality of buffer layers 691 can have the same thickness as the substrate disposed on the stage 160. Accordingly, when the plurality of wiring lines is printed using the printing pad, the printing pad can be supported even on the outside of the substrate at the same height as the substrate by the plurality of buffer layers 691 and the plurality of side guides 170.

The plurality of buffer layers 691 can be made of a material smaller than the modulus of the plurality of side lines. For example, the plurality of buffer layers 691 can be made of a material such as an acrylic-based or epoxy-based resin. Meanwhile, the plurality of buffer layers 691 can be made of an elastic material such as a spring. Accordingly, when the plurality of buffer layers 691 are disposed to be in contact with the side portion of the substrate, it is possible to reduce a physical collision that can occur on the substrate. However, any material can be used without limitation as long as the material forming the plurality of buffer layers 691 is a material having elasticity.

In the device 600 for manufacturing a side line, the method of manufacturing a side line, and the method of manufacturing a display device according to still another embodiment of the present disclosure, the plurality of side guides 170 are disposed adjacent to a substrate to suppress the printing pad P from being inclined during the printing process with respect to the side line, so the first side line and the second side line can be accurately connected. Accordingly, the yield and productivity of the display device can also be improved by reducing the signal transmission defect due to the inaccurate formation of wiring lines.

In addition, in the device 600 for manufacturing a side line, the method of manufacturing a side line, and the method of manufacturing a display device according to still another embodiment of the present disclosure, the plurality of buffer layers 691 can suppress damage that can occur on the side surface of the substrate during the process of manufacturing the plurality of side lines. For example, the plurality of already formed side lines or other components can be disposed on the side surface of the substrate. Accordingly, in the device 600 for manufacturing a side line according to still another embodiment of the present disclosure, the plurality of buffer layers 691 made of a material having elasticity or a small modulus are disposed to be in contact with the side surface of the substrate, so it is possible to suppress damage to the plurality of side lines and other components that can occur on the side surface of the substrate.

Figure 7:
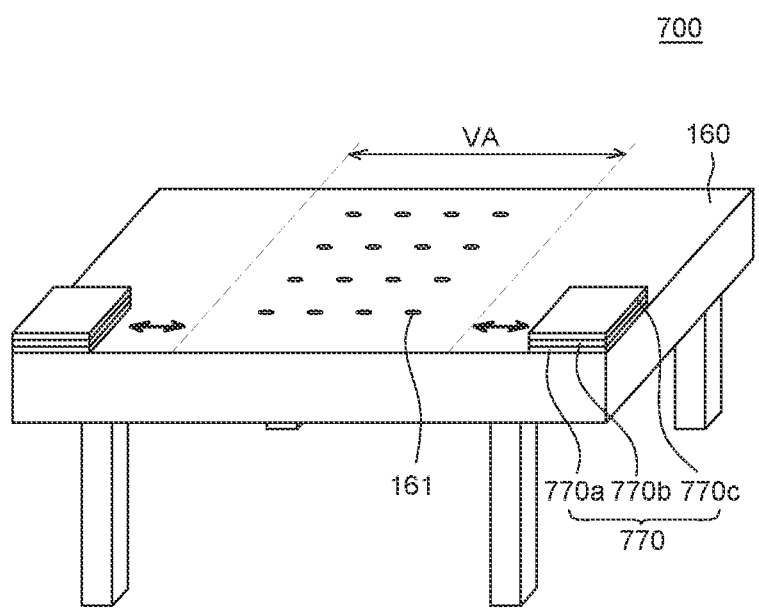
FIG. 7 is a schematic perspective view of a device for manufacturing a side line according to still another embodiment of the present disclosure.

FIG. 7 is a schematic perspective view of a device for manufacturing a side line according to still another embodiment of the present disclosure. A device 700 for manufacturing a side line illustrated in FIG. 7 is different from the device 100 for manufacturing a side line described with reference to FIGS. 1 to 4I in terms of only a plurality of side guides 770, and other components are substantially the same, and therefore, redundant descriptions thereof will be omitted or may be provided briefly.

The side guide 770 can be formed of a plurality of layers. For example, the side guide 770 includes a first side guide 770a, a second side guide 770b, and a third side guide 770c.

The first side guide 770a can be disposed at a lowermost portion in the side guides 770 and can be disposed to be in contact with the stage 160. A second side guide 770b can be disposed on the first side guide 770a. The second side guide 770b can be disposed to have the same size as the first side guide 770a. A third side guide 770c can be disposed on the second side guide 770b. The third side guide 770c can be disposed to have the same size as the first side guide 770a and the second side guide 770b.

The first side guide 770a, the second side guide 770b, and the third side guide 770c can have the same physical properties. For example, the first side guide 770a, the second side guide 770b, and the third side guide 770c can be made of a material having the same modulus as a substrate to be disposed on the stage 160. For example, in the case of printing the plurality of side lines using the printing pad P, the printing pad P can be supported at the same rigidity by the first side guide 770a, the second side guide 770b, and the third side guide 770c.

The device 700 for manufacturing a side line according to still another embodiment of the present disclosure can further include a fixing part. The fixing part can be disposed to fix the side guide 770 to the stage 160. The fixing part suppresses slipping or separation of the first side guide 770a, the second side guide 770b, and the third side guide 770c constituting the side guide 770, so the side guide 770 can have the fixed shape on the stage 160.

The side guide 770 can be assembled and disassembled. For example, the side guide 770 can be constituted by only the first side guide 770a by disassembling the second side guide 770b and the third side guide 770c. Accordingly, a side guide 770 formed of a single layer can be disposed on the stage 160. On the other hand, in the side guide 770, the second side guide 770b and the third side guide 770c are assembled and thus can be constituted by the first side guide 770a, the second side guide 770b and the third side guide 770c. Accordingly, the side guide 770 formed of three layers can be disposed on the stage 160. Accordingly, the height of the side guide 770 as a whole can be adjusted through assembly and disassembly of the side guide 770.

As described above, the side guide 770 can be configured to have the same thickness as a substrate having various thicknesses by assembling and disassembling the side guide 770. Accordingly, when the plurality of side lines are printed using the printing pad, the printing pad can be supported even on the outside of the substrate at the same height as the substrate by the side guide 770.

In FIG. 7, the side guide 770 is illustrated as having a three-layer structure including the first side guide 770a, the second side guide 770b, and the third side guide 770c, but the number of layers forming the side guide 770 is not limited thereto.

In the device 700 for manufacturing a side line, the method of manufacturing a side line, and the method of manufacturing a display device according to still another embodiment of the present disclosure, the plurality of side guides 170 are disposed adjacent to a substrate to suppress the printing pad P from being inclined during the printing process with respect to the side line, so the first side line and the second side line can be accurately connected. Accordingly, the yield and productivity of the display device can also be improved by reducing the signal transmission defect due to the inaccurate formation of wiring lines.

In addition, in the device 700 for manufacturing a side line, the method of manufacturing a side line, and the method of manufacturing a display device according to still another embodiment of the present disclosure, the side guide 770 is disposed in a multi-layer structure, and the height of the side guide can be adjusted by assembling or disassembling the side guide 770. For example, the side guides 770 can be disposed in a single layer or in a multi-layer structure formed of two or more layers. Accordingly, when substrates having various thicknesses are used, the side guide 770 can have the same height as that of the substrate through assembly and disassembly. Accordingly, in the device 700 for manufacturing a side line according to still another embodiment of the present disclosure, the height of the side guide 770 can be easily changed by configuring the side guide 770 in a multi-layer structure, and it is possible to form the side lines with the improved straightness and uniformity without limiting the thickness of the substrate.

Figure 8A:
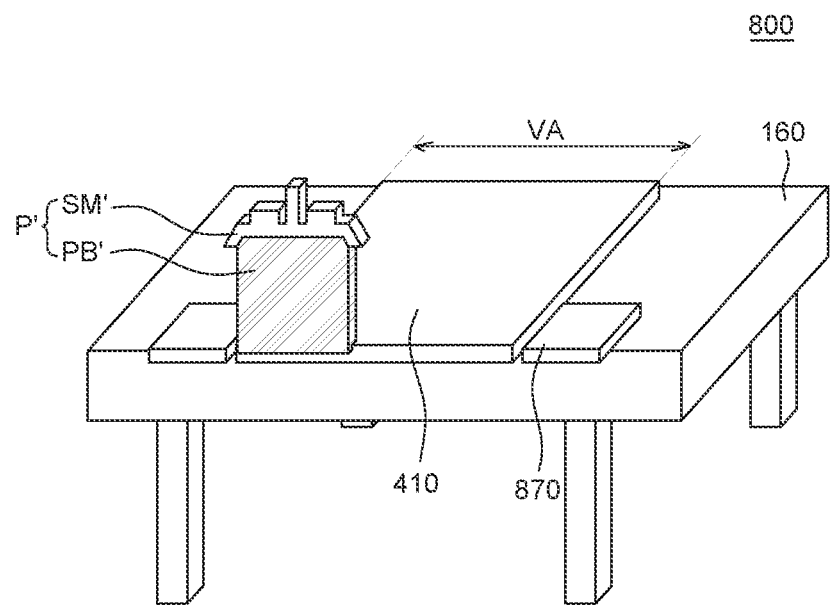
FIGS. 8A and 8B are schematic perspective views of a device for manufacturing a side line on which a substrate is loaded for describing a process of printing a side line.
Figure 8B:
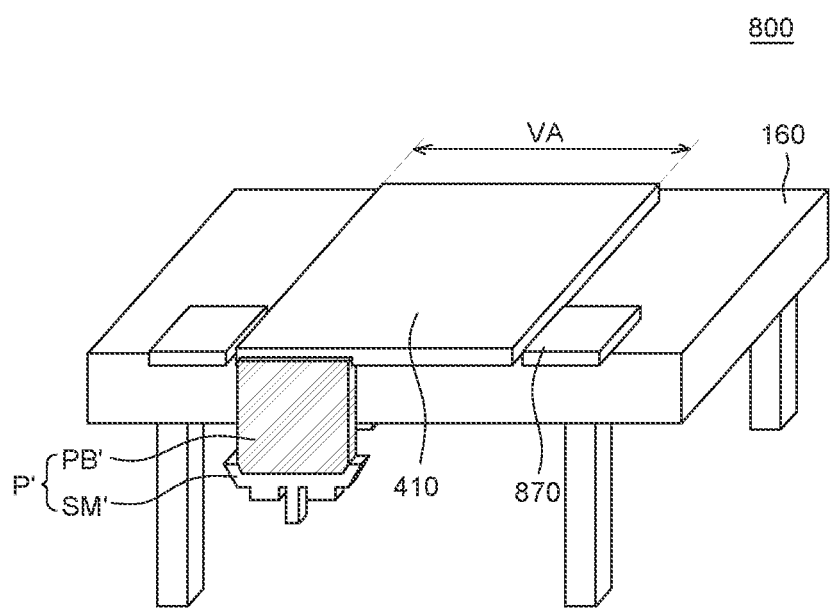

FIGS. 8A and 8B are schematic perspective views of a device for manufacturing a side line on which a substrate is loaded for describing a process of printing a side line. FIG. 8A is schematic perspective views of a device for manufacturing a side line on which the substrate 410 is loaded for describing the process of printing a first side line. FIG. 8B is schematic perspective views of a device 800 for manufacturing a side line on which the substrate 410 is loaded for describing the process of printing the second side line. A device 800 for manufacturing a side line illustrated in FIGS. 8A and 8B is different from the device 100 for manufacturing a side line described with reference to FIGS. 1 to 4I in terms of only a printing pad P and a side guide 870, and other components are substantially the same, and therefore, redundant descriptions thereof will be omitted or may be provided briefly.

Referring to FIG. 8A, a printing unit is disposed on a top surface of the substrate 410 that is a second surface opposite to the first surface of the substrate 410 contacting with the stage 160. The printing unit includes a printing pad P' for printing the plurality of first side lines on the substrate 410.

The printing pad P' can include a support member SM' and a pad body PB' fixed to the support member SM'. The support member SM' is a structure for fixing the pad body PB'. The pad body PB' is a member for printing a plurality of side lines on the substrate 410. For example, a side line can be formed by printing the pad body PB' on the substrate 410 in a state in which the conductive paste is applied to the pad body PB'. In this case, the conductive paste can be in a state in which a material having high electrical conductivity, such as silver (Ag) or copper (Cu), is prepared in the form of a paste.

The printing pad P' can print a plurality of first side lines on a top surface of the substrate 410 that is a second surface opposite to the first surface of the substrate 410 and a side surface of the substrate 410. The printing pad driver can lower the printing pad P' in the state which the substrate 410 is loaded on the stage 160 to be in contact with the side surface of the substrate 410 and a portion of the top surface of the substrate 410 and print the plurality of first side lines on the side surface of the substrate 410 and the top surface of the substrate 410.

The printing pad P' can move from one end to the other end of the substrate 410 and form the plurality of first side lines by printing the conductive paste plural times.

Subsequently, the printing pad can print a plurality of second side lines on the first surface of the substrate and the side surface of the substrate contacting with the stage.

Referring to FIG. 8B, a printing unit is disposed on the bottom surface of the substrate 410 which is the first surface of the substrate 410 contacting with the stage 160. The printing pad driver can raise the printing pad P' in the state which the substrate 410 is loaded on the stage 160 to be in contact with the bottom surface of the substrate 410 and a portion of the side surface of the substrate 410 and print the plurality of second side lines on the bottom surface of the substrate 410 and the side surface of the substrate 410.

In this case, the substrate 410 and the plurality of side guides 870 can protrude to the outside of the stage 160 so that the printing pad P' contacts with a portion of the bottom surface of the substrate 410 to print the second side line.

The plurality of second side lines can be formed by printing the printing pad P' on the substrate 410 plural times. In this case, the manufacturing process of printing the plurality of second side lines on the bottom surface and the side surface of the substrate 410 using the printing pad P' can be substantially the same as the manufacturing process of printing the plurality of first side lines described with reference to FIG. 8A. For example, the plurality of second side lines can be formed in such a manner that the printing pad P' moves from one end to the other end of the substrate 410 and the conductive paste is printed plural times.

In the device 800 for manufacturing a side line, the method of manufacturing a side line, and the method of manufacturing a display device according to still another embodiment of the present disclosure, the plurality of side guides 870 are disposed adjacent to a substrate to suppress the printing pad P' from being inclined during the printing process with respect to the side line, so the first side line and the second side line can be accurately connected. Accordingly, the yield and productivity of the display device 400 can also be improved by reducing the signal transmission defect due to the inaccurate formation of wiring lines.

In addition, in the device 800 for manufacturing a side line, the method of manufacturing a side line, and the method of manufacturing a display device according to still another embodiment of the present disclosure, the plurality of second side lines can be formed on the substrate 410 by moving only the position of the printing pad P' without changing the position of the substrate 410 disposed on the stage 160. For example, the position of the substrate 410 contacting with the stage 160 may not be changed to form the second side line. Accordingly, in the device 800 for manufacturing a side line, the method of manufacturing a side line, and the method of manufacturing a display device according to still another embodiment of the present disclosure, the process of changing the position of the substrate 410 required between the process of forming the plurality of first side lines and the process of forming the plurality of second side lines may be omitted, thereby reducing the time and cost required for manufacturing the plurality of side lines 450.

In addition, in the device 800 for manufacturing a side line, the method of manufacturing a side line, and the method of manufacturing a display device according to still another embodiment of the present disclosure, it is possible to reduce damage that can occur on the substrate 410 during the process of changing the position of the substrate 410. For example, when the top surface of the substrate 410 is disposed to be in contact with the stage 160, the plurality of thin film transistors and the plurality of LEDs disposed on the top surface of the substrate 410 can be damaged by the contact with the stage 160. Further, the impact and damage to the substrate 410 can occur during the movement of the substrate 410. Accordingly, in the device 800 for manufacturing a side line, the method of manufacturing a side line, and the method of manufacturing a display device according to still another embodiment of the present disclosure, the process of changing the position of the substrate 410 required between the process of forming the plurality of first side lines and the process of forming the plurality of second side lines may be omitted, thereby reducing the time and cost required for manufacturing the plurality of side lines.

Figure 9A:
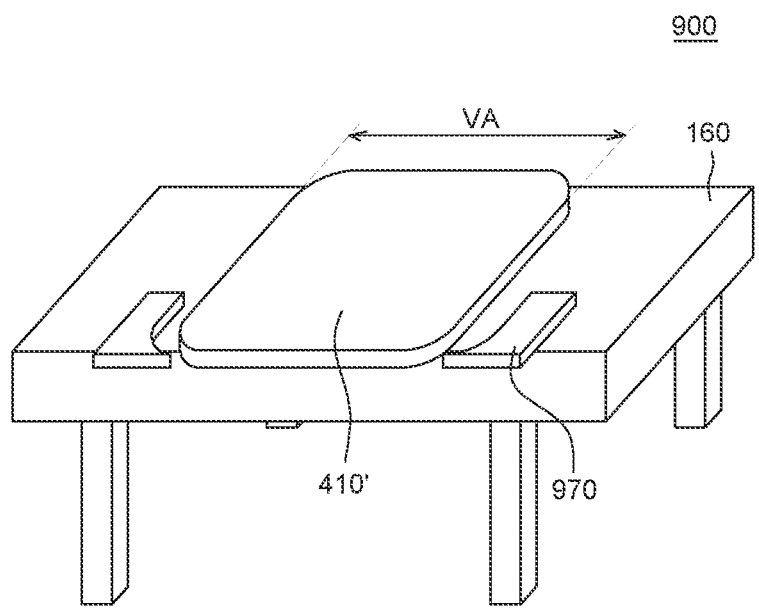
FIG. 9A is a schematic perspective view of a device for manufacturing a side line according to still another embodiment of the present disclosure.
Figure 9B:
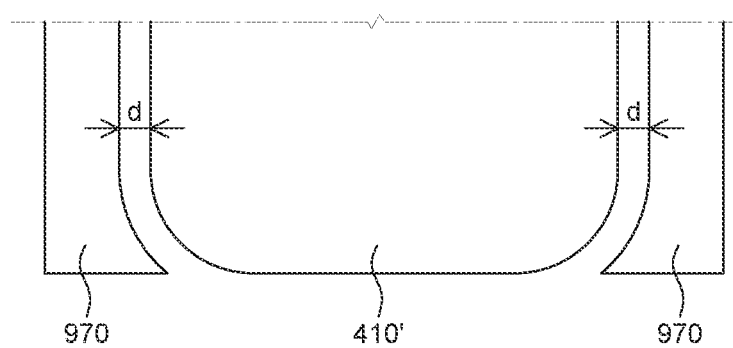
FIG. 9B is a schematic plane view of a device for manufacturing a side line according to still another embodiment of the present disclosure.
Figure 10A:
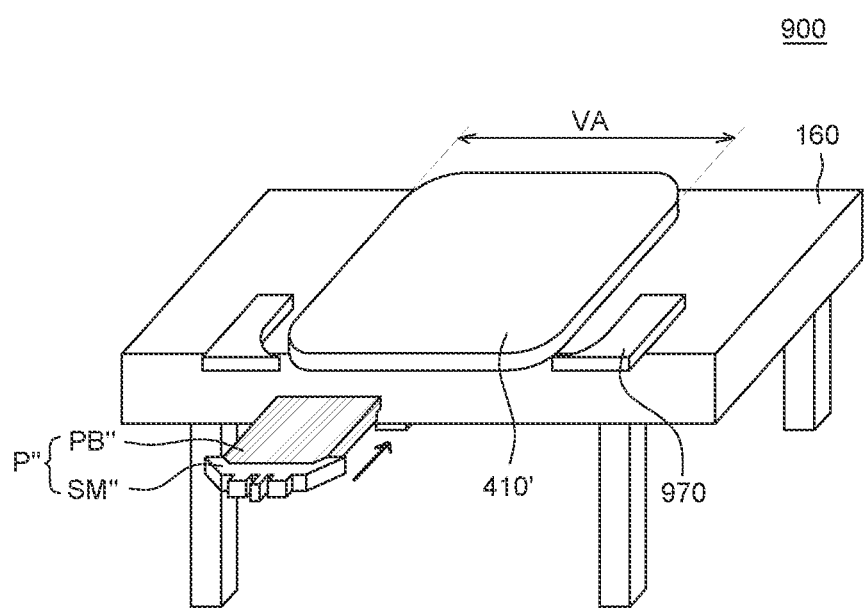
FIGS. 10A to 10B are diagrams for describing a method of manufacturing a side line and a method of manufacturing a display device according to still another embodiment of the present disclosure.
Figure 10B:
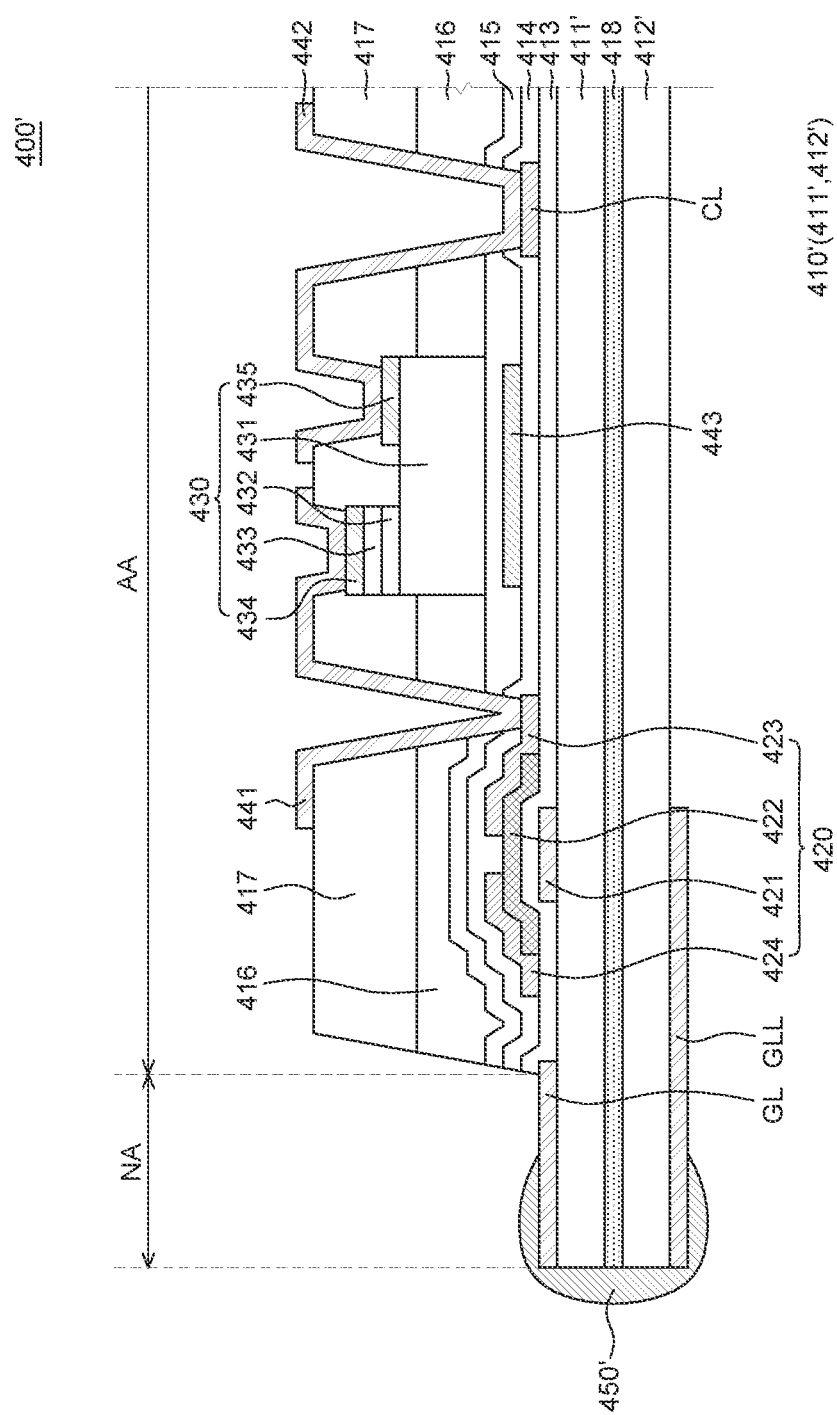

FIG. 9A is a schematic perspective view of a device for manufacturing a side line according to still another embodiment of the present disclosure. FIG. 9B is a schematic plane view of a device for manufacturing a side line according to still another embodiment of the present disclosure. FIGS. 10A to 10B are diagrams for describing a method of manufacturing a side line and a method of manufacturing a display device according to still another embodiment of the present disclosure. A device 900 for manufacturing a side line illustrated in FIGS. 9A to 10B is different from the device 800 for manufacturing a side line described with reference to FIGS. 8A and 8B in terms of only a plurality of side guides 970 and a printing pad P''', and other components are substantially the same, and therefore, redundant descriptions thereof will be omitted or may be provided briefly. In FIGS. 9A to 10B, it is assumed that a substrate 410' on which a side line is formed is a display panel, but the present disclosure is not limited thereto. Therefore, an object for connecting a conductive component disposed on the substrate on which the side line is formed, for example, a top surface thereof and a conductive component disposed on a bottom surface thereof can be variously changed. In FIG. 9B, only the plurality of side guides 970 and the substrate 410' are illustrated among the components of the device 900 for manufacturing a side line for convenience of description.

Referring to FIG. 9A, the substrate 410' and the plurality of side guides 970 can protrude to the outside of the stage 160. For example, an end of the substrate 410' and ends of the plurality of side guides 970 can be disposed to protrude to the side portion of the stage 160 without overlapping the stage 160.

A corner of the substrate 410' loaded on the stage 160 can have a rounded shape. As described above, when a tiling display is implemented, an impact can occur between display panels adjacent to each other. In particular, when the display panel has a rectangular parallelepiped shape, an impact can be applied to the adjacent display panel during tiling of adjacent display panels because the corner portion is sharp. Accordingly, by implementing the corner of the substrate 410' in a rounded shape, it is possible to minimize the impact between adjacent display panels when implementing the tiling display.

Referring to FIGS. 9A and 9B, the side guide 970 can have a shape corresponding to the side surface of the substrate 410'. Accordingly, the side guide 970 can have a shape corresponding to the corner having the rounded shape of the substrate 410'. In this case, a distance d between the side guide 970 and the substrate 410' can be constantly maintained.

Referring to FIG. 10A, a printing unit can be disposed in a lateral direction of the substrate 410'. The printing unit includes a printing pad P''' for printing a plurality of side lines 450' on the substrate 410'. The printing unit can include a printing pad driver configured to move the printing pad P'''.

The pad P''' can include a support member SM''' and a pad body PB''' fixed to the support member SM'''. The support member SM''' is a structure for fixing the pad body PB'''. The pad body PB''' is a member for printing a plurality of side lines 450' on the substrate 410'. For example, the side line 450' can be formed by printing the pad body PB''' on the substrate 410' in a state in which the conductive paste is applied to the pad body PB'''. In this case, the conductive paste can be in a state in which a material having high electrical conductivity, such as silver (Ag) or copper (Cu), is prepared in the form of a paste.

The printing pad P''' is in contact with the side surface of the substrate 410', the top surface of the substrate 410', and the bottom surface of the substrate 410', and the plurality of side lines 450' can be formed on the substrate 410' contacting with the printing pad P'''.

Referring to FIGS. 10A and 10B, the first surface of the substrate 410' contacting with the stage 160 is the bottom surface of the second substrate 412' in the substrate 410', and the second substrate 412' is disposed to be in contact with the stage 160. In addition, the second surface of the substrate 410' is the top surface of the first substrate 411' in the substrates 410'. For example, the printing pad P''' can print a plurality of side lines 450' on a bottom surface that is the first surface, a bottom surface that is the second surface opposite to the first surface, and a side surface of the substrate 410'. In this case, the printing pad driver moves one printing pad P''' in a horizontal direction while the substrate 410' is loaded on the stage 160 to simultaneously print a plurality of side lines 450' on the top, bottom, and side surfaces of the substrate 410'.

In the device 900 for manufacturing a side line, the method of manufacturing a side line, and the method of manufacturing a display device according to still another embodiment of the present disclosure, the plurality of side guides 970 for suppressing the printing pad P''' from being inclined can be disposed adjacent to the substrate 410' during the process of manufacturing the side line 450', thereby suppressing the printing pad P''' from being inclined during the process of printing the side line 450'. Specifically, when the corner of the substrate 410' disposed on the stage 160 has a rounded shape, the plurality of side guides 970 have a shape corresponding to the rounded shape of the corner of the substrate 410'. Thus, as the side line 450' is printed using the printing pad P''' in a state in which the plurality of side guides 970 are disposed adjacent to the substrate 410', the side line 450' disposed at the corner of the substrate 410' can be formed in a desired shape, for example, a shape extending in a direction perpendicular to the top and bottom surfaces of the substrate 410'. As a result, the straightness and uniformity of the side line 450' can be improved. As such, in the device 900 for manufacturing a side line, the method of manufacturing a side line, and the method of manufacturing a display device according to still another embodiment of the present disclosure, the side line 450' can be accurately connected, and as a result, a signal to be transmitted through the side line 450' can be accurately transmitted and the occurrence of problems such as heat generation due to the increase in the resistance of the side line 450' can be minimized. Accordingly, the yield and productivity of the display device 400' can also be improved by reducing the signal transmission failure due to the inaccurate formation of wiring lines.

The exemplary embodiments of the present disclosure can also be described as follows:

According to an aspect of the present disclosure, A device for manufacturing a side line, includes a stage on which a substrate is loaded; a side guide configured to be disposed adjacent to a side portion of the substrate loaded on the stage; and a printing unit configured to print a conductive paste on the substrate.

The side guide is integrally formed with the stage and can be disposed to protrude from a top surface of the stage.

A thickness of the side guide and a thickness of the substrate can be the same.

The device further can comprise a side guide driver configured to move the side guide. The side guide can be configured separately from the stage.

The side guide driver can be configured to dispose the side guide to be adjacent to a side portion of the substrate after the substrate is loaded on the stage.

When the substrate is loaded on the stage and the side guide can be disposed adjacent to a side portion of the substrate, a height of a top surface of the side guide and a height of a top surface of the substrate are the same.

The printing unit can include a printing pad for printing the side line on the substrate and a printing pad driver configured to move the printing pad. The printing pad driver lowers the printing pad to print the side line on a top surface and a side surface of the substrate while the substrate can be loaded on the stage.

A width of the substrate disposed between the side guides can be different from an integer multiple of a width of the printing pad in a longitudinal direction.

When the side line is printed on an end of the substrate, a part of the printing pad can overlap the substrate, and the other (or another) part of the printing pad can overlap the side guide.

The side guide can be made of a material having the same modulus as that of the substrate.

The device can further comprise a buffer layer configured to be disposed on one surface of the side guide between the side guide and the substrate.

The side guide can be formed of a plurality of stacked layers. The plurality of layers can be configured to enable assembly and disassembly.

The side guide can have a shape corresponding to a shape of a side surface of the substrate loaded on the stage.

A corner of the substrate loaded on the stage can have a rounded shape, and the side guide can have a shape corresponding to the rounded shape.

The printing unit can include a printing pad for printing the side line on the substrate and a printing pad driver configured to move the printing pad. The printing pad driver can move the printing pad toward a side surface of the substrate to print the side line on a top surface, a bottom surface, and the side surface of the substrate while the substrate can be loaded onto the stage.

According to another aspect of the present disclosure, a method of manufacturing a side line can comprise loading a substrate on a stage; disposing a side guide on a side portion of the substrate; and printing a plurality of first side lines on a second surface which is opposite to a first surface of the substrate contacting with the stage using a printing pad, and a side surface of the substrate.

The disposing of the side guide on the side portion of the substrate can include disposing the side guide having the same thickness as a thickness of the substrate.

The disposing of the side guide on the side portion of the substrate can include disposing the side guide to be adjacent the side portion of the substrate.

The printing of the plurality of first side lines includes printing the plurality of first side lines on the substrate plural times can be using the printing pad.

The printing of the plurality of first side lines can include printing the plurality of first side lines on both of one side of the substrate and one side of the side guide disposed adjacent to the one side of the substrate using the printing pad.

The method can further comprise disposing the substrate so that the second surface of the substrate is in contact with the stage; and printing a plurality of second side lines connected to the plurality of first side lines on the first surface of the substrate and the side surface of the substrate using the printing pad.

The loading of the substrate on the stage can include disposing the substrate to protrude to an outside of the stage. The disposing of the side guide on the side portion of the substrate can include disposing the side guide to protrude to the outside of the stage, and the method of manufacturing a side line further includes printing a plurality of second side lines on the first side surface of the substrate and the side surface of the substrate using the printing pad.

The printing of the plurality of first side lines can include simultaneously printing the plurality of first side lines on all of the first surface of the substrate in contact with the stage, the second surface which is opposite to the first surface of the substrate, and the side surface of the substrate, using the printing pad.

A corner of the substrate can have a rounded shape, and the side guide can have a shape corresponding to the rounded shape.

According to yet another aspect of the present disclosure, a method of manufacturing a display device can comprise forming a plurality of thin film transistors, a plurality of LEDs, a plurality of gate lines, and a plurality of data lines on a top surface of a first substrate; forming a plurality of gate link lines and a plurality of data link lines on a bottom surface of a second substrate; bonding the first substrate and the second substrate; and forming a plurality of side lines to connect the plurality of gate lines and the plurality of gate link lines, and to connect the plurality of data lines and the plurality of data link lines. The forming of the plurality of side lines can include loading the first substrate and the second substrate on a stage; disposing a side guide on side portions of the first substrate and the second substrate; printing a plurality of first side lines connected to a wiring line disposed on one of the first substrate and the second substrate; and printing a plurality of second side lines connected to a wiring line disposed on the other one of the first substrate and the second substrate and connected to the plurality of first side lines.

The printing of the plurality of first side lines and the printing of the plurality of second side lines can be performed simultaneously through one printing pad.

Corners of the first substrate and the second substrate can have a rounded shape, and the side guide can have a shape corresponding to the rounded shape.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A device for manufacturing a side line, the device comprising:
    a stage on which a substrate is loaded;
    a side guide configured to be disposed adjacent to a side portion of the substrate loaded on the stage; and
    a printing unit configured to print a conductive paste on the substrate,
    wherein the printing unit includes a printing pad for printing the side line on the substrate and a printing pad driver configured to move the printing pad, wherein the printing pad driver lowers the printing pad to print the side line on a top surface and a side surface of the substrate while the substrate is loaded on the stage, and wherein a width of the substrate disposed between side guides including the side guide is different from an integer multiple of a width of the printing pad in a longitudinal direction.

2. The device of claim 1, wherein the side guide is disposed on the stage and protrudes from a top surface of the stage.

3. The device of claim 2, wherein a thickness of the side guide and a thickness of the substrate are the same.

4. The device of claim 1, further comprising:
a side guide driver configured to move the side guide, wherein the side guide is configured separately from the stage.

5. The device of claim 4, wherein the side guide driver is configured to dispose the side guide to be adjacent to a side portion of the substrate after the substrate is loaded on the stage.

6. The device of claim 4, wherein when the substrate is loaded on the stage and the side guide is disposed adjacent to a side portion of the substrate, a height of a top surface of the side guide and a height of a top surface of the substrate are the same.

7. The device of claim 1, wherein when the side line is printed on an end of the substrate, a part of the printing pad overlaps the substrate, and another part of the printing pad overlaps the side guide.

8. The device of claim 1, wherein the side guide is made of a material having a same modulus as that of the substrate.

9. The device of claim 1, further comprising:
a buffer layer configured to be disposed on one surface of the side guide between the side guide and the substrate.

10. The device of claim 1, wherein the side guide is formed of a plurality of stacked layers, and
the plurality of layers is configured to enable assembly and disassembly.

11. The device of claim 1, wherein the side guide has a shape corresponding to a shape of a side surface of the substrate loaded on the stage.

12. The device of claim 11, wherein a corner of the substrate loaded on the stage has a rounded shape, and
the side guide has a shape corresponding to the rounded shape.

13. The device of claim 12, wherein the printing unit includes a printing pad for printing the side line on the substrate and a printing pad driver configured to move the printing pad, and
the printing pad driver moves the printing pad toward a side surface of the substrate to print the side line on a top surface, a bottom surface, and the side surface of the substrate while the substrate is loaded onto the stage.

14. A method of manufacturing a side line, the method comprising:
loading a substrate on a stage;
disposing a side guide on a side portion of the substrate; and
printing a plurality of first side lines of the side line on a second surface of the substrate and on a side surface of the substrate using a printing pad, the second surface being opposite to a first surface of the substrate contacting with the stage,
wherein the printing pad is moved by a printing pad driver,
wherein the printing pad driver lowers the printing pad to print the side line on a top surface and a side surface of the substrate while the substrate is loaded on the stage, and
wherein a width of the substrate disposed between side guides including the side guide is different from an integer multiple of a width of the printing pad in a longitudinal direction.

15. The method of claim 14, wherein the disposing of the side guide on the side portion of the substrate includes disposing the side guide having the same thickness as a thickness of the substrate.

16. The method of claim 14, wherein the disposing of the side guide on the side portion of the substrate includes disposing the side guide to be adjacent the side portion of the substrate.

17. The method of claim 16, wherein the printing of the plurality of first side lines includes printing the plurality of first side lines on the substrate plural times using the printing pad.

18. The method of claim 17, wherein the printing of the plurality of first side lines includes printing the plurality of first side lines on both of one side of the substrate and one side of the side guide disposed adjacent to the one side of the substrate using the printing pad.

19. The method of claim 14, further comprising:
disposing the substrate so that the second surface of the substrate is in contact with the stage; and
printing a plurality of second side lines connected to the plurality of first side lines on the first surface of the substrate and the side surface of the substrate using the printing pad.

20. The method of claim 14, wherein the loading of the substrate on the stage includes disposing the substrate to protrude to an outside of the stage,
the disposing of the side guide on the side portion of the substrate includes disposing the side guide to protrude to the outside of the stage, and
the method of manufacturing the side line further comprises printing a plurality of second side lines on the first side surface of the substrate and the side surface of the substrate using the printing pad.

21. The method of claim 14, wherein the printing of the plurality of first side lines includes simultaneously printing the plurality of first side lines on all of the first surface of the substrate in contact with the stage, the second surface which is opposite to the first surface of the substrate, and the side surface of the substrate, using the printing pad.

22. The device of claim 21, wherein a corner of the substrate has a rounded shape, and
the side guide has a shape corresponding to the rounded shape.

* * * * *